(12) United States Patent
Choi et al.

(10) Patent No.: US 12,439,799 B2
(45) Date of Patent: Oct. 7, 2025

(54) DISPLAY APPARATUS AND METHOD OF MANUFACTURING THE SAME

(71) Applicant: Samsung Display Co., Ltd., Yongin-si (KR)

(72) Inventors: Yoonsun Choi, Yongin-si (KR); Seunghwan Cho, Yongin-si (KR); Wonsuk Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 491 days.

(21) Appl. No.: 18/077,560

(22) Filed: Dec. 8, 2022

(65) Prior Publication Data

US 2023/0189617 A1  Jun. 15, 2023

(30) Foreign Application Priority Data

Dec. 9, 2021 (KR) .................. 10-2021-0176110
Aug. 16, 2022 (KR) .................. 10-2022-0102232

(51) Int. Cl.
*H10K 59/40*  (2023.01)
*G06F 3/041*  (2006.01)
*H10K 59/12*  (2023.01)
*H10K 59/131*  (2023.01)
*H10K 71/00*  (2023.01)
*H10K 77/10*  (2023.01)
*H10K 102/00*  (2023.01)

(52) U.S. Cl.
CPC ........... *H10K 59/40* (2023.02); *H10K 59/131* (2023.02); *H10K 71/00* (2023.02); *H10K 77/111* (2023.02); *G06F 3/041* (2013.01); *H10K 59/1201* (2023.02); *H10K 2102/311* (2023.02)

(58) Field of Classification Search
CPC ...... H10K 59/40; H10K 59/131; H10K 71/00; H10K 77/111; H10K 59/1201; H10K 2102/311; H10K 59/124; G06F 3/041
See application file for complete search history.

(56) References Cited

U.S. PATENT DOCUMENTS

| 10,285,278 | B2 | 5/2019 | Namkung et al. |
| 10,361,385 | B2 | 7/2019 | Choi et al. |
| 10,482,817 | B2 | 11/2019 | Kim et al. |
| 10,593,739 | B2 * | 3/2020 | Son ...................... H10K 59/122 |
| 10,672,802 | B2 | 6/2020 | Lee et al. |

(Continued)

FOREIGN PATENT DOCUMENTS

| KR | 10-2017-0096089 | 8/2017 |
| KR | 10-2018-0064619 | 6/2018 |

(Continued)

*Primary Examiner* — J. E. Schoenholtz
(74) *Attorney, Agent, or Firm* — Harness, Dickey & Pierce, P.L.C.

(57) ABSTRACT

A display apparatus includes a peripheral area including a first area, a bending area, and a second area, a display area, a first insulating layer located in the display area and at least a portion of the peripheral area, a gate electrode located in the display area, a first connection electrode located in the display area, a first organic insulating layer arranged in the display area and the peripheral area, a second organic insulating layer located in the display area and the peripheral area, and an input line including a first transmission line located in the first area, and a second transmission line located in the bending area.

30 Claims, 34 Drawing Sheets

(56) References Cited

U.S. PATENT DOCUMENTS

| | | |
|---|---|---|
| 10,797,123 B2 | 10/2020 | Cho et al. |
| 2019/0123126 A1* | 4/2019 | Song .................... G09G 3/3266 |
| 2019/0333981 A1* | 10/2019 | Kawata ................ H10D 86/451 |
| 2020/0058725 A1* | 2/2020 | Ka ........................ H10K 59/131 |
| 2021/0273205 A1 | 9/2021 | Lee et al. |
| 2021/0343820 A1* | 11/2021 | Ming ................... H10K 77/111 |
| 2023/0413623 A1* | 12/2023 | Zeng ......................... G09F 9/30 |
| 2024/0065060 A1* | 2/2024 | Kawata ................ H10K 77/111 |

FOREIGN PATENT DOCUMENTS

| | | |
|---|---|---|
| KR | 10-2019-0064716 | 6/2019 |
| KR | 10-2019-0098311 | 8/2019 |
| KR | 10-2079256 | 2/2020 |
| KR | 10-2021-0110468 | 9/2021 |

* cited by examiner

DISPLAY APPARATUS AND METHOD OF MANUFACTURING THE SAME

CROSS-REFERENCE TO RELATED APPLICATION(S)

This application claims priority under 35 U.S.C. § 119 to Korean Patent Application No. 10-2021-0176110 filed on Dec. 9, 2021 and Korean Patent Application No. 10-2022-0102232 filed on Aug. 16, 2022; the Korean Patent Applications are incorporated by reference.

BACKGROUND

1. Technical Field

The disclosure relates to a display apparatus and a method of manufacturing the same.

2. Description of the Related Art

Recently, display apparatuses have been widely used. Also, because the thickness and weight of the display apparatuses have been decreased, the use of the display apparatuses has widened. As the display apparatuses are variously utilized, various designs of the display apparatuses have been developed, for example, at least some portions thereof are bent.

SUMMARY

The disclosure relates to a display apparatus with a bent portion, and provides a display apparatus for which the number of masks used during the manufacture of the display apparatus is reduced, and a method of manufacturing the display apparatus. However, this is merely an example, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a peripheral area including a first area, a bending area, and a second area, a display area, a first insulating layer located in the display area and at least a portion of the peripheral area and arranged on a substrate, a gate electrode located in the display area and on the first insulating layer, a first connection electrode arranged in the display area and on the gate electrode, a first organic insulating layer arranged in the display area and the peripheral area and overlapping the first connection electrode in a plan view, a second organic insulating layer arranged in the display area and the peripheral area and arranged on the first organic insulating layer, and an input line including a first transmission line located in the first area and arranged on the first insulating layer, and a second transmission line located in the bending area and arranged on the second organic insulating layer.

The display apparatus may further include a data line arranged in the display area and electrically connected to the input line.

The display apparatus may further include a buffer layer located in the display area and the peripheral area and arranged on the substrate, a semiconductor pattern located in the display area and arranged between the buffer layer and the first insulating layer, a second insulating layer located in the display area and the peripheral area and arranged on the gate electrode, an upper electrode located in the display area and arranged on the second insulating layer, a third insulating layer located in the display area and the peripheral area and arranged on the upper electrode, a second connection electrode located in the display area and arranged between the first organic insulating layer and the second organic insulating layer, and a third connection electrode located in the display area and arranged on the second organic insulating layer.

At least a portion of the second transmission line may extend to the first area.

The display apparatus may further include a conductive pattern located in the first area and arranged on the first organic insulating layer.

The display apparatus may further include a first contact hole exposing at least a portion of the first transmission line, and a second contact hole exposing at least a portion of the conductive pattern.

The first contact hole may be in the second insulating layer, the third insulating layer, and the first organic insulating layer.

The second contact hole may be in the second organic insulating layer.

The first transmission line may be electrically connected to the conductive pattern through the first contact hole, and the conductive pattern may be electrically connected to the second transmission line through the second contact hole.

The first transmission line and the gate electrode may be arranged on a same layer, or the first transmission line and the upper electrode may be arranged on a same layer.

The display apparatus may further include a third organic insulating layer located in the display area and the peripheral area and overlapping the second transmission line in a plan view.

The display apparatus may further include a protective layer arranged between the third insulating layer and the first organic insulating layer.

The input line may further include a third transmission line located in the second area and arranged on the first insulating layer.

The display apparatus may further include a pad located in the second area and arranged on the third transmission line, wherein the pad may include a first pad electrode arranged on the third transmission line.

The display apparatus may further include a third contact hole exposing at least a portion of the third transmission line, wherein the third transmission line may be electrically connected to the first pad electrode through the third contact hole.

The pad may further comprise a second pad electrode arranged on the first pad electrode.

The input line may further include a first input line and a second input line, and the data line may include a first data line and a second data line.

The first data line may be directly and electrically connected to the first input line through a fourth contact hole, and the second input line may be electrically connected to the second data line through a data transmission line.

The display apparatus may further include a horizontal connection line arranged on the first organic insulating layer and extending in a first direction, and a vertical connection line arranged on the second organic insulating layer and extending in a second direction intersecting the first direction.

The vertical connection line may be electrically connected to the second input line.

The first data line may at least partially overlap the horizontal connection line in a plan view.

The horizontal connection line may be electrically connected to the second data line and the vertical connection line.

The horizontal connection line may be electrically connected to the vertical connection line in the display area.

The horizontal connection line may be electrically connected to the second data line in the display area.

The display apparatus may further include an auxiliary horizontal connection line spaced apart from the horizontal connection line in the first direction, and an auxiliary vertical connection line spaced apart from the vertical connection line in the second direction.

The second data line may at least partially overlap the auxiliary horizontal connection line in a plan view.

The display apparatus may further include an additional vertical connection line arranged on the second organic insulating layer and electrically connected to the horizontal connection line and the second data line.

The additional vertical connection line may be electrically connected to the second data line in the peripheral area.

The vertical connection line and the second data line may be integral with each other.

The display apparatus may further include an additional auxiliary vertical connection line spaced apart from the additional vertical connection line in the second direction.

Other aspects, features, and advantages other than those described above will become apparent from the following detailed description, claims and drawings for carrying out the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
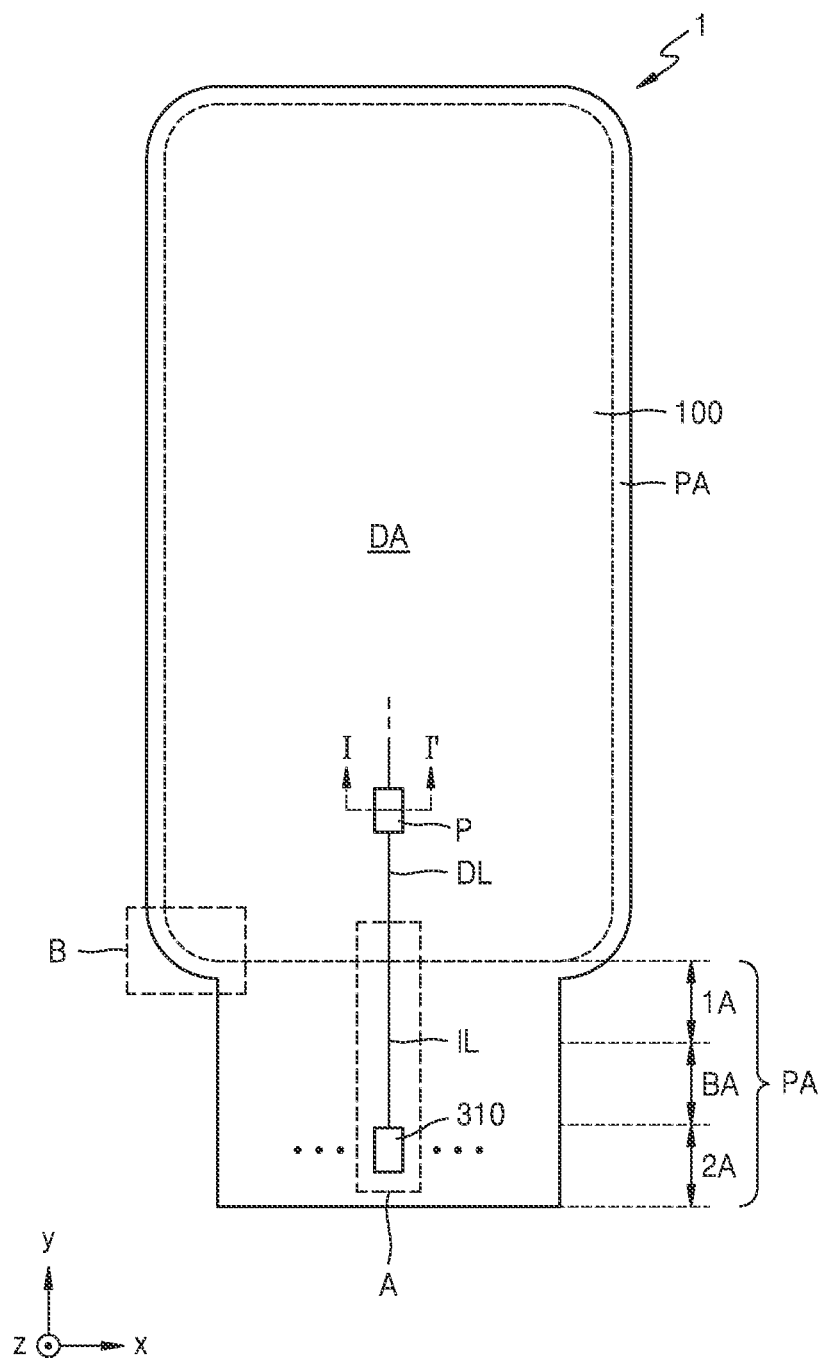
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

The term "and/or" includes all combinations of one or more of which associated configurations may define. For example, "A and/or B" may be understood to mean "A, B, or A and B." The phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, particular embodiments will be illustrated in the drawings and described in detail in the written description. The attached drawings for illustrating preferred embodiments of the disclosure are referred to in order to gain a sufficient understanding of the disclosure, the merits thereof, and the objectives accomplished by the implementation of the disclosure. The disclosure may, however, be embodied in many different forms and should not be construed as being limited to the embodiments set forth herein.

It will be understood that although the terms "first", "second," and the like may be used herein to describe various elements, these elements should not be limited by these terms, and these elements are only used to distinguish one element from another.

As used herein, the singular forms "a," "an" and "the" are intended to include the plural forms (or meanings) as well, unless the context clearly indicates otherwise.

It will be further understood that the terms "comprises," "includes" "has" and/or their variants used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present. It will be understood that the terms "contact," "connected to," and "coupled to" may include a physical and/or electrical contact, connection, or coupling.

Sizes of elements in the drawings may be exaggerated for convenience of explanation. In other words, since sizes and thicknesses of elements in the drawings are arbitrarily illustrated for convenience of explanation, the following embodiments are not limited thereto.

In embodiments below, when a wire is referred to as "extending in a first direction or a second direction," the wire may extend in a straight line or extend in a zigzag form or in a curve in the first direction or the second direction.

In embodiments below, the expression "in a plan view" may indicate that an object is viewed from the top, and the expression "in a cross-sectional view" may indicate that a cross-section of a target portion, which is vertically cut, is viewed from the side. When an element "overlaps" another element, the element may overlap the other element "in a plan view" and "in a cross-sectional view."

Hereinafter, one or more embodiments of the disclosure will be described in detail with reference to the accompanying drawings, and like elements in the drawings denote like elements.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic plan view of a display apparatus according to an embodiment.

Referring to FIG. 1, a display apparatus 1 may include a substrate 100. The display apparatus 1 may be various products such as a smartphone, a tablet computer, a laptop, a television (TV), or a billboard.

The substrate 100 may include a display area DA and a peripheral area PA on the outer side of the display area DA. Because the display apparatus 1 includes the substrate 100, it may be described that the display apparatus 1 has the display area DA and the peripheral area PA. Hereinafter, for convenience, it is described that the substrate 100 has the display area DA and the peripheral area PA.

The display area DA is an area where an image is displayed, and pixels P may be arranged in the display area DA. When viewed in a direction substantially perpendicular to the substrate 100, the display area DA may have various shapes, for example, a circle, an oval, a polygon, or a certain-shaped figure. FIG. 1 illustrates that the display area DA has a substantially rectangular shape having round edges.

The peripheral area PA may be arranged on the outer side of the display area DA. The peripheral area PA may include a first area 1A adjacent to the display area DA, a bending area BA outside the first area 1A, and a second area 2A that is opposite to the first area 1A with respect to the bending area BA. The first area 1A, the second area 2A, and the bending area BA may be in the peripheral area PA.

Although not illustrated, the substrate 100 and/or the display apparatus 1 are bent in the bending area BA, and thus, when viewed in a z-axis direction, at least a portion of the second area 2A may overlap the display area DA. The disclosure is not limited to the display apparatus 1 that is bent, and may also be applied to the display apparatus 1 that is not bent. The first area 1A, the second area 2A, and the bending area BA may be non-display areas. As the substrate 100 and/or the display apparatus 1 are bent in the bending area BA, the non-display area may not be viewed when the display apparatus 1 is viewed from a front surface thereof (e.g., in a −z direction), or a viewed area of the non-display area may decrease even though the non-display area is viewed.

In an embodiment, pads 310 may be arranged in the second area 2A. Although not illustrated, a driving chip may be arranged in the second area 2A. The driving chip and a display surface of the display area DA may be mounted on a same surface, but as described above, the driving chip may be on a rear surface of the display area DA as the substrate 100 and/or the display apparatus 1 are bent in the bending area BA.

On an end portion of the second area 2A of the substrate 100, a printed circuit board, etc. may be attached. The printed circuit board, etc. may be electrically connected to the driving chip, etc. through the pads 310 on the substrate 100.

Hereinafter, an organic light-emitting display apparatus is described as an example of the display apparatus 1, but the display apparatus 1 is not limited thereto. For example, the display apparatus 1 may be a display apparatus such as an inorganic light-emitting display apparatus (or an inorganic EL display apparatus), or a quantum dot light-emitting display apparatus. For example, an emission layer of a display element of the display apparatus 1 may include an organic material or an inorganic material. Also, the display apparatus 1 may include an emission layer and quantum dots arranged in a path of light emitted from the emission layer.

As described above, in case that the substrate 100 and/or the display apparatus 1 are bent in the bending area BA, there is a need for the substrate 100 to be flexible or bendable. In this case, the substrate 100 may include polymer resin such as polyethersulfone, polyarylate, polyetherimide, polyethylene naphthalate, polyethylene terephthalate, polyphenylene sulfide, polyarylate, polyimide, polycarbonate, or cellulose acetate propionate. Various modifications may be made to the substrate 100, and for example, the substrate 100 may have a multilayered structure that includes two layers including the above polymer resin and a barrier layer including an inorganic material (silicon oxide, silicon nitride, silicon oxynitride, or the like) and arranged between the layers.

In the display area DA, the pixels P may be arranged. Each pixel P may denote a sub-pixel and may include a display element such as an organic light-emitting diode OLED. The pixel P may emit, for example, red light, green light, blue light, or white light.

The pixels P may be electrically connected to outer circuits arranged in the peripheral area PA. Although not illustrated, in the peripheral area PA, a first scan driving circuit, a second scan driving circuit, an emission control driving circuit, a first power supply line, and a second power supply line may be arranged.

The first scan driving circuit may provide a scan signal to the pixel P through a scan line. The second scan driving circuit may be arranged alongside the first scan driving circuit with the display area DA therebetween. Some of the pixels P arranged in the display area DA may be electrically connected to the first scan driving circuit, and the others of the pixels P may be connected to the second scan driving circuit. According to necessity, the second scan driving circuit may be omitted, and all of the pixels P arranged in the display area DA may be electrically connected to the first scan driving circuit.

Although not illustrated, the display apparatus 1 may further include a controller. An input line IL may be arranged in the peripheral area PA, and a data line DL may be arranged in the display area DA. The input line IL may be electrically connected to the data line DL. The controller may generate data signals, and the generated data signals may be transmitted to the input line IL through the pads 310 and may be transmitted to the pixel P through the data line DL connected to the input line IL.

For reference, the term "line" may indicate a "wire," which is applied to embodiments below and modified examples.

Figure 2:
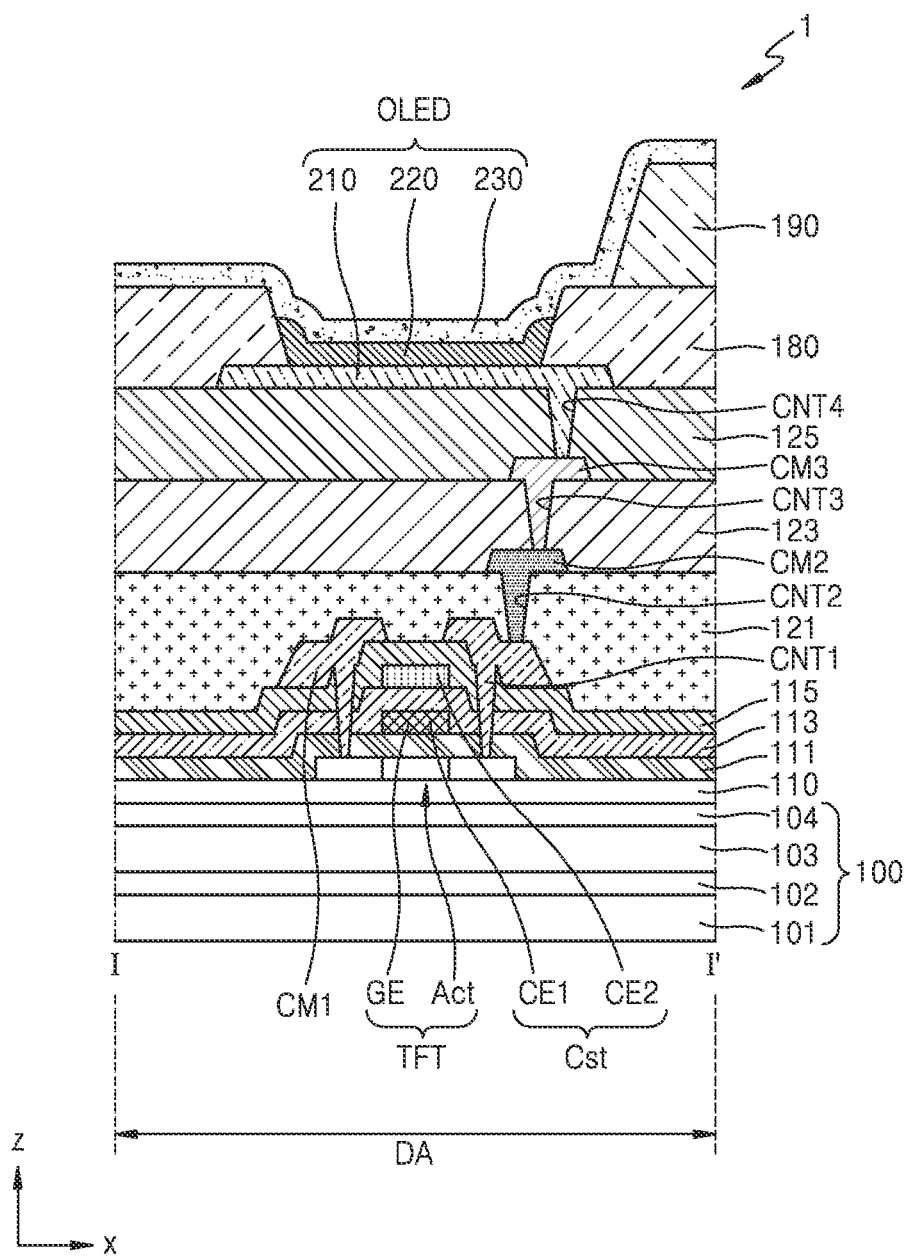
FIG. 2 is a schematic diagram of a display apparatus according to an embodiment.

FIG. 2 is a schematic diagram of a display apparatus according to an embodiment. In detail, FIG. 2 is a schematic cross-sectional view of the display apparatus, taken along line I-I' of FIG. 1.

Referring to FIG. 2, the substrate 100 may include a first base layer 101, a first barrier layer 102, a second base layer 103, and a second barrier layer 104 that are sequentially stacked.

The first base layer 101 may include an organic material. For example, the first base layer 101 may include any one of polyimide, polyethylene naphthalate, polyethylene terephthalate, polyarylate, polycarbonate, polyetherimide, and polyethersulfone.

The first barrier layer 102 may be arranged on the first base layer 101. The first barrier layer 102 may include an inorganic material. For example, the first barrier layer 102 may include silicon oxide, silicon oxynitride, silicon nitride, amorphous silicon, or the like. In an embodiment, the first barrier layer 102 may include a first layer and a second layer. In this case, the first layer may include silicon oxide, and the second layer may include amorphous silicon. However, one or more embodiments are not limited thereto.

The second base layer 103 may be arranged on the first barrier layer 102. The second base layer 103 and the first base layer 101 may include a same material. However, one or more embodiments are not limited thereto. The second base layer 103 and the first base layer 101 may include different materials. In an embodiment, a thickness of the second base layer 103 may be less than that of the first base layer 101.

The second barrier layer 104 may be arranged on the second base layer 103. The second barrier layer 104 may include an inorganic material. For example, the second barrier layer 104 may include silicon oxide, silicon oxynitride, silicon nitride, or the like. In an embodiment, the second barrier layer 104 may include a first layer and a second layer. In this case, the first layer may include silicon oxynitride, and the second layer may include silicon oxide. However, one or more embodiments are not limited thereto.

A buffer layer 110 may be arranged on the substrate 100. The buffer layer 110 may decrease or prevent the penetration of foreign impurities, moisture, or external air from the bottom of the substrate 100. The buffer layer 110 may include an inorganic material such as silicon oxide, silicon oxynitride, or silicon nitride and may be a layer or layers including the above material.

On the buffer layer 110, a thin-film transistor TFT including a semiconductor pattern Act and a gate electrode GE may be arranged. The semiconductor pattern Act may be arranged on the buffer layer 110. The semiconductor pattern Act may include a silicon semiconductor. The semiconductor pattern Act may include polysilicon. However, one or more embodiments are not limited thereto. The semiconductor pattern Act may include amorphous silicon. As another example, the semiconductor pattern Act may include an oxide semiconductor. The oxide semiconductor may include a crystalline or amorphous oxide semiconductor.

FIG. 2 illustrates only a portion of the semiconductor pattern Act, and the semiconductor pattern Act may be further arranged in other portions of the pixels P. The semiconductor pattern Act may include a high-doping area and a low-doping area. The high-doping area and the low-doping area may be doped with N-type dopants or P-type dopants. A P-type transistor may include a high-doping area and a low-doping area doped with P-type dopants. In this case, the content of the P-type dopants in the high-doping area may be greater than the content of the P-type dopants in the low-doping area.

Although not illustrated, the semiconductor pattern Act may include a source, an active, and a drain. The source and the drain may be apart from each other with the active therebetween.

A first insulating layer 111 may be arranged on the buffer layer 110. The first insulating layer 111 may cover (or overlap, e.g., in a plan view) the semiconductor pattern Act. In an embodiment, the first insulating layer 111 may include an inorganic material such as silicon oxide, silicon oxynitride, or silicon nitride and may be a layer or layers including the above material.

On the first insulating layer 111, the gate electrode GE of the thin-film transistor TFT may be arranged. The gate electrode GE may be a portion of a metal pattern. The gate electrode GE may at least partially overlap the semiconductor pattern Act arranged under the gate electrode GE. For example, the gate electrode GE may overlap the active arranged thereunder. The gate electrode GE may include low-resistance conductive materials such as molybdenum (Mo), aluminum (Al), copper (Cu), and/or titanium (Ti) and may be a layer or layers including the above materials.

A second insulating layer 113 may be arranged on the first insulating layer 111. The second insulating layer 113 may cover the gate electrode GE arranged on the first insulating layer 111. The second insulating layer 113 may include an inorganic material such as silicon oxide, silicon oxynitride, or silicon nitride and may be a layer or layers including the above material.

An upper electrode CE2 may be arranged on the second insulating layer 113. The upper electrode CE2 may at least partially overlap a lower electrode CE1 arranged thereunder. The upper electrode GE2 may be a portion of a metal pattern or a portion of a doped semiconductor pattern. The lower electrode CE1 and the upper electrode CE2, which overlap each other with the second insulating layer 113 therebetween, may form a storage capacitor Cst. In an embodiment, the gate electrode GE may be integrally formed with the lower electrode CE1. However, one or more embodiments are not limited thereto. The gate electrode GE may be apart from the lower electrode CE1.

A third insulating layer 115 may be arranged on the second insulating layer 113. The third insulating layer 115 may cover the upper electrode CE2 arranged on the second insulating layer 113. The third insulating layer 115 may include an inorganic material such as silicon oxide, silicon oxynitride, or silicon nitride and may be a layer or layers including the above material. In an embodiment, the third insulating layer 115 may include silicon oxide layers and silicon nitride layers that are alternately arranged.

First connection electrodes CM1 may be arranged on the third insulating layer 115. The first connection electrodes CM1 may each be electrically connected to the semiconductor pattern Act through a first contact hole CNT1 defined in the first, second, and third insulating layers 111, 113, and 115. However, one or more embodiments are not limited thereto. Each first connection electrode CM1 may include low-resistance conductive materials such as Mo, Al, Cu, and/or Ti and may be a layer or layers including the above materials. For example, the first connection electrode CM1 may have a stack structure including Ti/Al/Ti.

At least one organic insulating layer may be arranged on the third insulating layer 115. In an embodiment, a first organic insulating layer 121, a second organic insulating layer 123, and a third organic insulating layer 125 may be arranged on the third insulating layer 115. The first organic insulating layer 121, the second organic insulating layer 123, and the third organic insulating layer 125 may each be a single polyimide-based resin layer. However, one or more embodiments are not limited thereto. The first organic insulating layer 121, the second organic insulating layer 123, and the third organic insulating layer 125 may each include at least one of acryl-based resin, methacrylic resin, polyisoprene, vinyl resin, epoxy-based resin, urethane-based resin, cellulose-based resin, siloxane-based resin, polyamide-based resin, and perylene-based resin.

A second connection electrode CM2 may be arranged on the first organic insulating layer 121. The second connection electrode CM2 may be electrically connected to the first connection electrode CM1 through a second contact hole CNT2 defined in the first organic insulating layer 121. The second connection electrode CM2 may include low-resistance conductive materials such as Mo, Al, Cu, and/or Ti and may be a layer or layers including the above materials. For example, the second connection electrode CM2 may have a stack structure including Ti/Al/Ti.

A third connection electrode CM3 may be arranged on the second organic insulating layer 123. The third connection electrode CM3 may be electrically connected to the second connection electrode CM2 through a third contact hole CNT3 defined in the second organic insulating layer 123. The third connection electrode CM3 may include low-resistance conductive materials such as Mo, Al, Cu, and/or Ti and may be a layer or layers including the above materials. For example, the third connection electrode CM3 may have a stack structure including Ti/Al/Ti.

An organic light-emitting diode OLED including a pixel electrode 210, an intermediate layer 220, and an opposite electrode 230 may be arranged on the third organic insulating layer 125. The pixel electrode 210 may be arranged on the third organic insulating layer 125. The pixel electrode 210 may be electrically connected to the third connection electrode CM3 through a fourth contact hole CNT4 defined in the third organic insulating layer 125. The pixel electrode 210 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 210 may include a reflection film including silver (Ag), magnesium (Mg), Al, platinum (Pt), palladium (Pd), gold (Au), nickel (Ni), neodymium (Nd), iridium (Ir), chromium (Cr), or a compound thereof. In an embodiment, the pixel electrode 210 may further include a film including ITO, IZO, ZnO, or $In_2O_3$ on/under the above reflection film. For example, the pixel electrode 210 may have a multilayered structure of ITO/Ag/ITO.

On the pixel electrode 210, a pixel-defining layer 180 including an opening exposing at least a portion of the pixel electrode 210 may be arranged. The opening defined in the pixel-defining layer 180 may define an emission area of light emitted from the organic light-emitting diode OLED. For example, a width of the opening defined in the pixel-defining layer 180 may correspond to a width of the emission area.

The pixel-defining layer 180 may include an organic insulating material. As another example, the pixel-defining layer 180 may include an inorganic insulating material such as silicon nitride, silicon oxynitride, or silicon oxide. As another example, the pixel-defining layer 180 may include an organic insulating material and an inorganic insulating material. In an embodiment, the pixel-defining layer 180 may include a light-shielding material and may be black. The light-shielding material may include carbon black, a carbon nanotube, resin or paste including a black dye, metal particles such as Ni, Al, Mo, and an alloy thereof, metal oxide particles (e.g., chromium oxide), or metal nitride particles (e.g., chromium nitride), or the like. In case that the pixel-defining layer 180 includes the light-shielding material, reflection of external light by metal structures arranged under the pixel-defining layer 180 may decrease.

A spacer 190 may be arranged on the pixel-defining layer 180. The spacer 190 may include an organic insulating material such as polyimide. As another example, the spacer 190 may include an inorganic insulating material such as silicon oxide, silicon nitride, or silicon oxynitride or may include an organic insulating material and an inorganic insulating material.

In an embodiment, the spacer 190 and the pixel-defining layer 180 may include a same material. The pixel-defining layer 180 and the spacer 190 may be formed together by a mask process using a halftone mask. In an embodiment, the pixel-defining layer 180 and the spacer 190 may include different materials.

The intermediate layer 220 may be arranged on the pixel electrode 210. The intermediate layer 220 may include a first functional layer, an emission layer, and a second functional layer that are sequentially stacked. The first functional layer and the second functional layer may be collectively referred to as an organic functional layer.

The emission layer may be in the opening of the pixel-defining layer 180. The emission layer may include a high-molecular-weight or low-molecular-weight organic material emitting light of a color.

The first functional layer may be arranged between the pixel electrode 210 and the emission layer, and the second functional layer may be arranged between the emission layer and the opposite electrode 230. However, one or more embodiments are not limited thereto. At least one of the first functional layer and the second functional layer may be omitted.

The first functional layer may include, for example, a hole transport layer (HTL) or a HTL and a hole injection layer (HIL). The second functional layer may include an electron transport layer (ETL) and/or an electron injection layer (EIL). The first functional layer and/or the second functional layer may be common layers to entirely cover the substrate 100.

The opposite electrode 230 may include a conductive material having a low work function. For example, the opposite electrode 230 may include a (translucent) transparent layer including Ag, Mg, Al, Pt, Pd, Au, Ni, Nd, Ir, Cr, lithium (Li), calcium (Ca), or an alloy thereof. As another example, the opposite electrode 230 may further include a layer including ITO, IZO, ZnO, or $In_2O_3$ on the (translucent) transparent layer including the above material.

Although not illustrated, a capping layer may be further arranged on the opposite electrode 230. The capping layer may include LiF, an inorganic material, and/or an organic material.

Although not illustrated, an encapsulation member may be arranged on the organic light-emitting diode OLED. The encapsulation member may be a thin-film encapsulation layer including at least one inorganic layer and at least one organic layer. As another example, the encapsulation member may be an encapsulation substrate.

Figure 3:
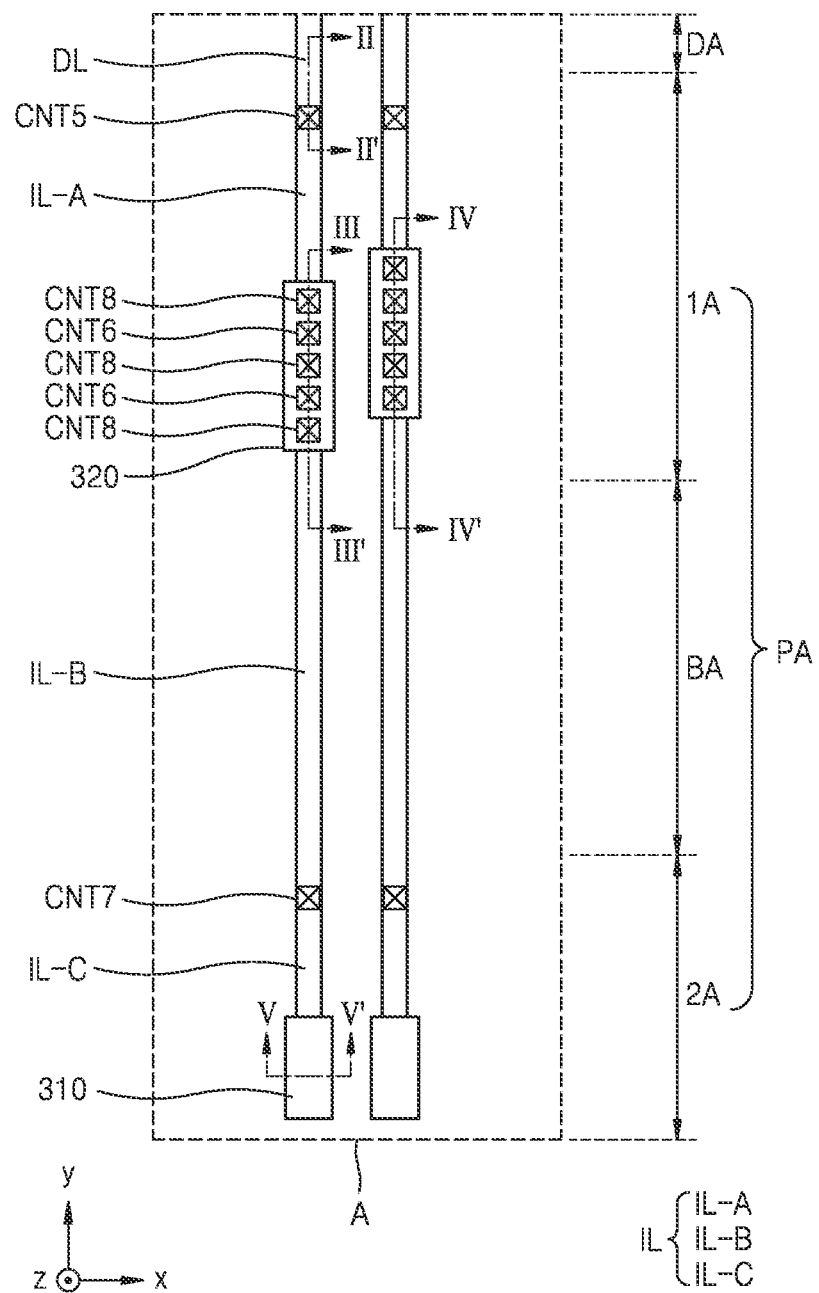
FIG. 3 is a schematic plan view of a portion of a display apparatus according to an embodiment.

FIG. 3 is a schematic plan view of a portion of a display apparatus according to an embodiment. In detail, FIG. 3 is a schematic view of enlarged region A of FIG. 1.

Referring to FIGS. 1 and 3, the peripheral area PA may include the first area 1A, the bending area BA, and the second area 2A. The bending area BA may be between the first area 1A and the second area 2A.

In an embodiment, the pads 310 may be arranged in the peripheral area PA. The pads 310 may be arranged in the second area 2A. FIG. 3 illustrates that the pads 310 may be on a same line in an x direction, but one or more embodiments are not limited thereto. The pads 310, which are adjacent to each other, may be alternately arranged.

The input line IL may be between the pads 310 and the display area DA. In an embodiment, a side of the input line IL may be connected to the data line DL in the display area DA, and another side thereof may be connected to the pad 310. The input line IL may be configured to transmit, to the data line DL, a data signal generated by a controller (not illustrated).

In an embodiment, the input line IL may include a first transmission line IL-A, a second transmission line IL-B, and a third transmission line IL-C. The first transmission line IL-A may be arranged (or located) in the first area 1A, the second transmission line IL-B may be arranged (or located) in the bending area BA, and the third transmission line IL-C may be arranged (or located) in the second area 2A. In this case, at least a portion of the first transmission line IL-A arranged (or located) in the first area 1A may extend to the bending area BA. Therefore, at least a portion of the first transmission line IL-A may be arranged (or located) in the bending area BA. Also, at least a portion of the third transmission line IL-C arranged (or located) in the second area 2A may extend to the bending area BA. Therefore, at least a portion of the third transmission line IL-C may be arranged (or located) in the bending area BA. However, one or more embodiments are not limited thereto. For example, at least a portion of the second transmission line IL-B arranged (or located) in the bending area BA may extend to the first and second areas 1A and 2A and thus may be arranged (or located) in the first and second areas 1A and 2A.

In an embodiment, the data line DL may be electrically connected to the input line IL through a fifth contact hole CNT5. In detail, the first transmission line IL-A of the input line IL may be electrically connected to the data line DL through the fifth contact hole CNT5. Also, the first transmission line IL-A may be electrically connected to the second transmission line IL-B through sixth contact holes CNT6 and eighth contact holes CNT8, and the second transmission line IL-B may be electrically connected to the third transmission line IL-C through a seventh contact hole CNT7. In this case, the fifth contact hole CNT5, the sixth contact hole CNT6, and the eighth contact hole CNT8 may be in the first area 1A, and the seventh contact hole CNT7 may be in the second area 2A. However, one or more embodiments are not limited thereto. For example, the sixth contact hole CNT6, the seventh contact hole CNT7, and the eighth contact hole CNT8 may be in the bending area BA.

Also, FIG. 3 illustrates that two sixth contact holes CNT6 and three eighth contact holes CNT8 are defined, but one or more embodiments are not limited thereto. Various modifications may be made, and for example, one sixth contact hole CNT6 and one eighth contact hole CNT8 may be defined.

Also, FIG. 3 illustrates that the sixth contact holes CNT6 and the eighth contact holes CNT8 are on a straight line in a second direction (e.g., a y direction) in a plan view, but one or more embodiments are not limited thereto. For example, the sixth contact holes CNT6 and the eighth contact holes CNT8 may be apart from each other in a first direction (e.g., an x direction) in a plan view. As another example, the sixth contact holes CNT6 and the eighth contact holes CNT8 may be apart from each other in a plan view in a direction that is diagonal to the first direction (e.g., the x direction) and the second direction (e.g., the y direction).

Figure 4:
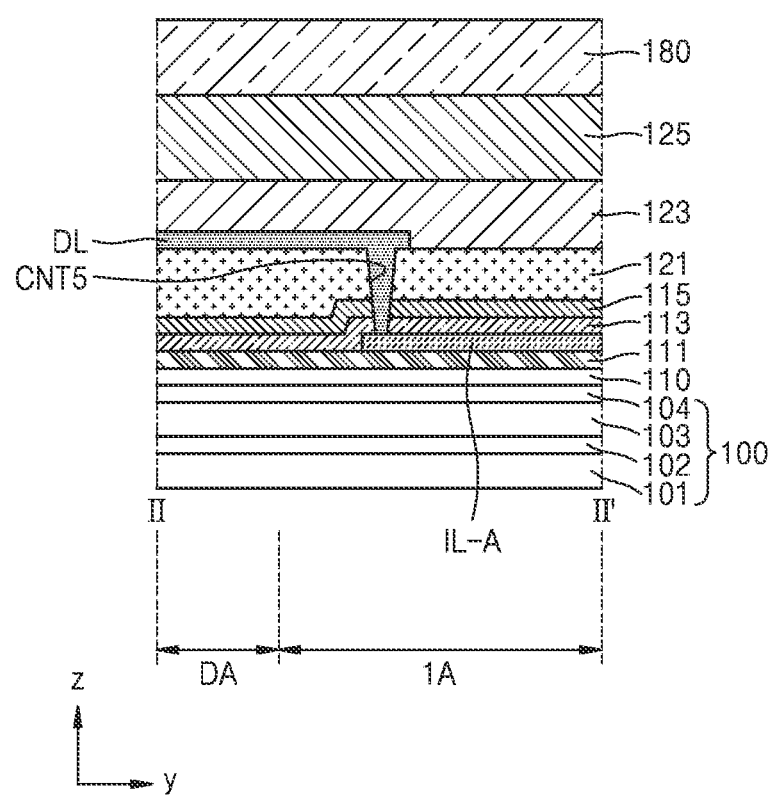
FIG. 4 is a schematic cross-sectional view of a display apparatus according to an embodiment.

FIG. 4 is a schematic cross-sectional view of a display apparatus according to an embodiment. In detail, FIG. 4 is a schematic cross-sectional view of the display apparatus taken along line II-II' of FIG. 3. The same reference symbols in FIGS. 2 and 4 denote the same elements, and their descriptions are not repeated.

Referring to FIGS. 2 to 4, the substrate 100 may include the first base layer 101, the first barrier layer 102, the second base layer 103, and the second barrier layer 104 that are sequentially stacked. The buffer layer 110, the first insulating layer 111, the second insulating layer 113, the third insulating layer 115, the first organic insulating layer 121, the second organic insulating layer 123, the third organic insulating layer 125, and the pixel-defining layer 180 may be sequentially arranged on the substrate 100. However, one or more embodiments are not limited thereto. The spacer 190 (see FIG. 2) described above with reference to FIG. 2 may be arranged instead of the pixel-defining layer 180.

The input line IL may include the first transmission line IL-A, the second transmission line IL-B, and the third transmission line IL-C. In an embodiment, the first transmission line IL-A of the input line IL may be arranged (or located) in the first area 1A. The data line DL may be arranged (or located) in the display area DA. The data line DL may be in the display area DA, and at least a portion of the data line DL may extend to the first area 1A and thus may be arranged therein.

The first transmission line IL-A of the input line IL may be arranged on the first insulating layer 111. For example, the first transmission line IL-A and the gate electrode GE (see FIG. 2) may include a same material and may be provided on a same layer. However, one or more embodiments are not limited thereto. The first transmission line IL-A of the input line IL may be arranged on the second insulating layer 113. In this case, the first transmission line IL-A and the upper electrode CE2 (see FIG. 2) may include a same material and may be provided on a same layer. For reference, the description that components are on a same layer may indicate that the components are simultaneously formed by using a same material and a same mask process. In this case, the components may include a same material.

The data line DL may be on the first organic insulating layer 121. For example, the data line DL and the second connection electrode CM2 (see FIG. 2) may include a same material and may be provided on a same layer. However, one or more embodiments are not limited thereto. The data line DL may be on the third insulating layer 115 or the second organic insulating layer 123. In case that the data line DL is on the third insulating layer 115, the data line DL and the first connection electrode CM1 (see FIG. 2) may include a same material and may be provided on a same layer. As another example, in case that the data line DL is on the second organic insulating layer 123, the data line DL and the third connection electrode CM3 (see FIG. 2) may include a same material and may be provided on a same layer.

The first transmission line IL-A of the input line IL may be electrically connected to the data line DL through the fifth contact hole CNT5. The fifth contact hole CNT5 may be in the first area 1A. However, one or more embodiments are not limited thereto. The fifth contact hole CNT5 may be in the display area DA. In an embodiment, the fifth contact hole CNT5 may be defined in the second insulating layer 113, the third insulating layer 115, and the first organic insulating layer 121. However, one or more embodiments are not limited thereto.

Figure 5:
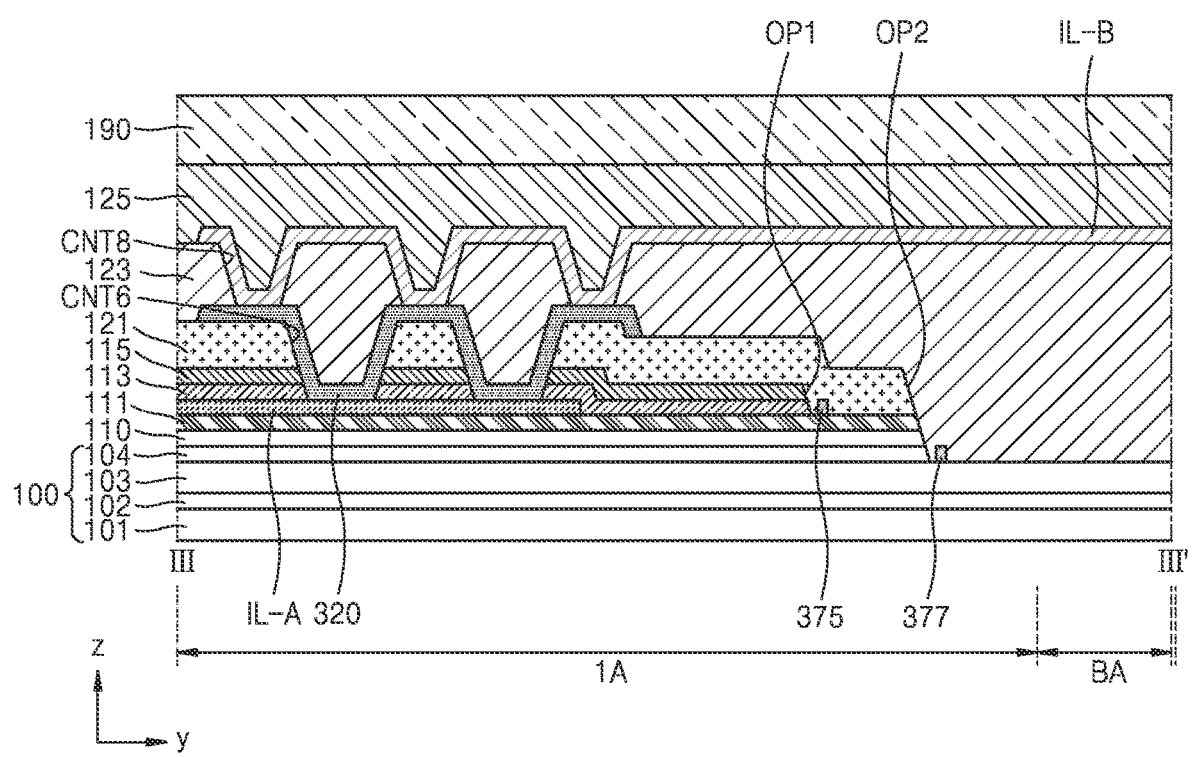
FIG. 5 is a schematic diagram of a display apparatus according to an embodiment.

FIG. 5 is a schematic diagram of a display apparatus according to an embodiment. FIG. 5 is a schematic cross-sectional view of the display apparatus taken along line III-III' of FIG. 3. The same reference symbols in FIGS. 2 and 5 denote the same elements, and their descriptions are not repeated.

Referring to FIGS. 2 to 5, the buffer layer 110, the first insulating layer 111, the second insulating layer 113, the third insulating layer 115, the first organic insulating layer 121, the second organic insulating layer 123, the third organic insulating layer 125, and the spacer 190 may be sequentially arranged on the substrate 100. However, one or more embodiments are not limited thereto. The pixel-defining layer 180 (see FIG. 2) described above with reference to FIG. 2 may be arranged instead of the spacer 190.

In an embodiment, the first transmission line IL-A of the input line IL may be in the first area 1A. Also, the second transmission line IL-B of the input line IL may be in the bending area BA. As described above, the second transmission line IL-B may be in the bending area BA, but at least a portion of the second transmission line IL-B may extend to the first area 1A. Therefore, at least a portion of the second transmission line IL-B may be in the first area 1A.

In an embodiment, the first transmission line IL-A may be electrically connected to the second transmission line IL-B through a conductive pattern 320. In detail, the first transmission line IL-A may be electrically connected to the second transmission line IL-B through the conductive pattern 320 arranged in the first area 1A.

The first transmission line IL-A may be arranged on the first insulating layer 111. For example, the first transmission line IL-A and the gate electrode GE (see FIG. 2) may include a same material and may be provided on a same layer.

The conductive pattern 320 may be arranged on the first organic insulating layer 121. The conductive pattern 320 may be electrically connected to the first transmission line IL-A through the sixth contact holes CNT6 defined in the second insulating layer 113, the third insulating layer 115, and the first organic insulating layer 121. For example, at least a portion of the first transmission line IL-A may be exposed through the sixth contact holes CNT6 defined in the second insulating layer 113, the third insulating layer 115, and the first organic insulating layer 121, and the conductive pattern 320 may be arranged (or located) on the first transmission line IL-A of which a portion is exposed. The conductive pattern 320 and the second connection electrode CM2 (see FIG. 2) may include a same material and may be provided on a same layer.

The second organic insulating layer 123 may be arranged on the conductive pattern 320, and the second transmission line IL-B may be arranged on the second organic insulating layer 123. The second transmission line IL-B may be electrically connected to the conductive pattern 320 through the eighth contact holes CNT8 defined in the second organic insulating layer 123. For example, at least a portion of the conductive pattern 320 may be exposed through the eighth contact holes CNT8 defined in the second organic insulating layer 123, and the second transmission line IL-B may be arranged on the conductive pattern 320 of which at least a portion is exposed. Because the first transmission line IL-A of the input line IL is electrically connected to the conductive pattern 320 and the conductive pattern 320 is electrically connected to the second transmission line IL-B of the input line IL, the first transmission line IL-A of the input line IL may be electrically connected to the second transmission line IL-B of the input line IL.

In an embodiment, the sixth contact holes CNT6, which are defined in the second insulating layer 113, the third insulating layer 115, and the first organic insulating layer 121, may not overlap the eighth contact holes CNT8 defined in the second organic insulating layer 123 in a thickness direction of the substrate 100. However, one or more embodiments are not limited thereto. The sixth contact holes CNT6, which are defined in the second insulating layer 113, the third insulating layer 115, and the first organic insulating layer 121, may at least partially overlap the eighth contact holes CNT8, which are defined in the second organic insulating layer 123, in the thickness direction of the substrate 100.

In case that an inorganic insulating material is arranged in the bending area BA, cracks may appear in the inorganic insulating material because of tensile stress. Therefore, the inorganic insulating material may not be arranged in at least a portion of the bending area BA to prevent the cracks from appearing in the inorganic insulating material because of the tensile stress.

In an embodiment, the second insulating layer 113 and the third insulating layer 115 may have a first opening OP1 corresponding to the bending area BA. Also, the second barrier layer 104, the buffer layer 110, the first insulating layer 111, and the first organic insulating layer 121 may have a second opening OP2 corresponding to the bending area BA. In an embodiment, a width of the first opening OP1 may be greater than a width of the second opening OP2. However, one or more embodiments are not limited thereto. Also, while the inorganic insulating material formed in the bending area BA is removed, at least a portion of the second base layer 103 is also removed, and thus, an opening corresponding to the bending area BA may also be formed in the second base layer 103.

In an embodiment, a first residual film 375 and a second residual film 377 may exist in the first area 1A. The first residual film 375 may be on the first insulating layer 111, and the first residual film 375 and the first connection electrode CM1 (see FIG. 2) may be formed of (or include) a same material and by a same process. Also, the second residual film 377 may be on the second base layer 103, and the second residual film 377 and the conductive pattern 32 may be formed of (or include) a same material and by a same process. However, one or more embodiments are not limited thereto. The first residual film 375 and the second residual film 377 may be omitted.

Figure 6:
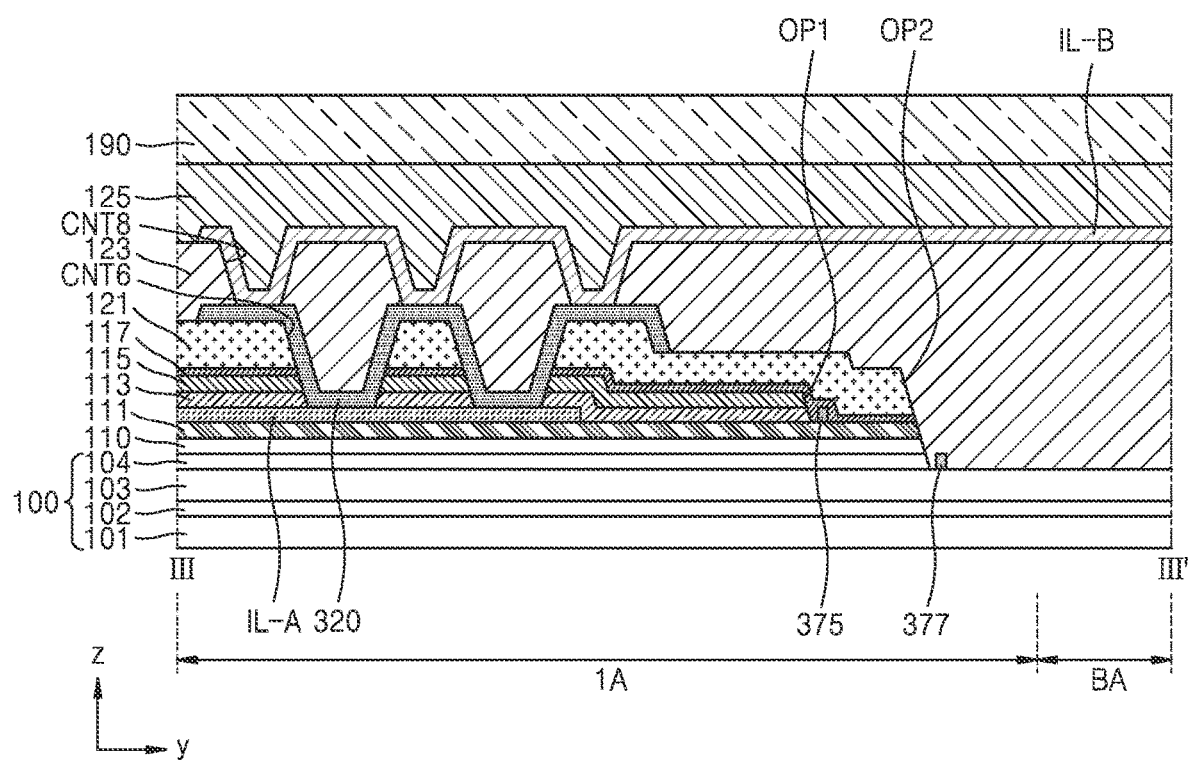
FIG. 6 is a schematic cross-sectional view of a display apparatus according to an embodiment.

FIG. 6 is a schematic cross-sectional view of a display apparatus according to an embodiment. In detail, the embodiment of FIG. 6 is different from that of FIG. 5 at least in that a protective layer 117 is further included between the third insulating layer 115 and the first organic insulating layer 121. The same reference symbols in FIGS. 5 and 6 denote the same elements, and thus, their descriptions are not repeated.

Referring to FIG. 6, the protective layer 117 may be further included between the third insulating layer 115 and the first organic insulating layer 121. The protective layer 117 may include silicon oxide, silicon oxynitride, silicon nitride, or the like. Because the protective layer 117 is further included between the third insulating layer 115 and the first organic insulating layer 121, damage to metal patterns arranged on the third insulating layer 115 may be prevented or may decrease during the manufacture of the display apparatus 1.

Figure 7:
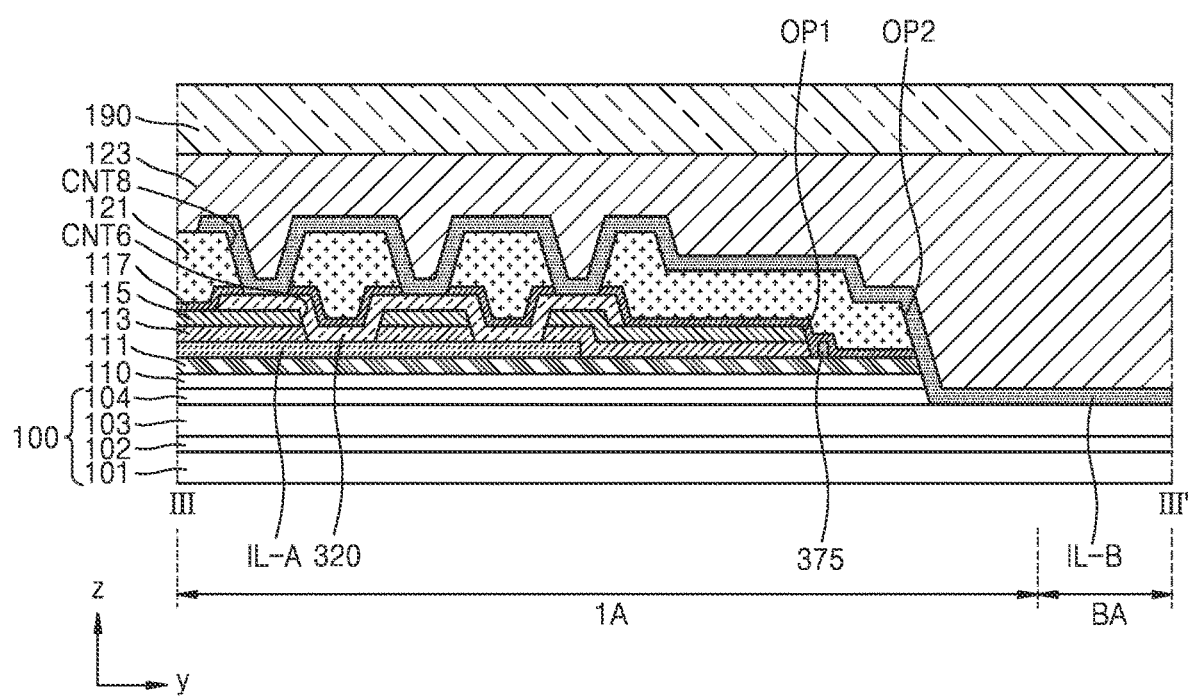
FIG. 7 is a schematic cross-sectional view of a display apparatus according to an embodiment.

FIG. 7 is a schematic cross-sectional view of a display apparatus according to an embodiment. The same reference symbols in FIGS. 5 and 7 denote the same elements, and thus, their descriptions are not repeated.

Referring to FIGS. 2, 3, and 5 to 7, the buffer layer 110, the first insulating layer 111, the second insulating layer 113, the third insulating layer 115, the protective layer 117, the first organic insulating layer 121, the second organic insulating layer 123, and the spacer 190 may be sequentially arranged on the substrate 100. However, at least one of the buffer layer 110, the first insulating layer 111, the second insulating layer 113, the third insulating layer 115, the protective layer 117, the first organic insulating layer 121, the second organic insulating layer 123, and the spacer 190 may be omitted.

In an embodiment, the first transmission line IL-A of the input line IL may be arranged in the first area 1A. Also, the second transmission line IL-B of the input line IL may be arranged in the bending area BA. As described above, the second transmission line IL-B may be arranged in the bending area BA, and at least a portion of the second transmission line IL-B may extend to the first area 1A. Therefore, at least a portion of the second transmission line IL-B may be arranged in the first area 1A

In an embodiment, the first transmission line IL-A may be electrically connected to the second transmission line IL-B through the conductive pattern 320. In detail, the first transmission line IL-A may be electrically connected to the second transmission line IL-B through the conductive pattern 320 arranged in the first area 1A.

The first transmission line IL-A may be arranged on the first insulating layer 111. For example, the first transmission line IL-A and the gate electrode GE (see FIG. 2) may include a same material and may be provided on a same layer.

The conductive pattern 320 may be arranged on the third insulating layer 115. The conductive pattern 320 may be electrically connected to the first transmission line IL-A through the sixth contact holes CNT6 defined in the second insulating layer 113 and the third insulating layer 115. For example, at least a portion of the first transmission line IL-A may be exposed through the sixth contact holes CNT6 defined in the second insulating layer 113 and the third insulating layer 115, and the conductive pattern 320 may be arranged on the first transmission line IL-A of which at least a portion is exposed. The conductive pattern 320 may and the first connection electrode CM1 (see FIG. 2) include a same material and may be provided on a same layer.

The protective layer 117 may be arranged on the conductive pattern 320, the first organic insulating layer 121 may be arranged on the protective layer 117, and the second transmission line IL-B may be arranged on the first organic insulating layer 121.

The second transmission line IL-B may be electrically connected to the conductive pattern 320 through the eighth contact holes CNT8 defined in the protective layer 117 and/or the first organic insulating layer 121. For example, at least a portion of the conductive pattern 320 may be exposed through the eighth contact holes CNT8 defined in the protective layer 117 and/or the first organic insulating layer 121, and the second transmission line IL-B may be arranged on the conductive pattern 320 of which at least a portion is exposed. Because the first transmission line IL-A of the input line IL is electrically connected to the conductive pattern 320 and the conductive pattern 320 is electrically connected to the second transmission line IL-B of the input line IL, the first transmission line IL-A of the input line IL may be electrically connected to the second transmission line IL-B of the input line IL.

In an embodiment, the second organic insulating layer 123 and/or the spacer 190 may be arranged on the second transmission line IL-B. However, one or more embodiments are not limited thereto. The third organic insulating layer 125 and/or the pixel-defining layer 180 may be further arranged between the second organic insulating layer 123 and the spacer 190.

In an embodiment, the second insulating layer 113 and the third insulating layer 115 may have the first opening OP1 corresponding to the bending area BA. Also, the second barrier layer 104, the buffer layer 110, the first insulating layer 111, the protective layer 117, and the first organic insulating layer 121 may have the second opening OP2 corresponding to the bending area BA. In an embodiment, the width of the first opening OP1 may be greater than that of the second opening OP2. However, one or more embodiments are not limited thereto. Also, while an inorganic film arranged in the bending area BA is removed, at least a portion of the second base layer 103 may also be arranged, and thus, an opening corresponding to the bending area BA may be formed in the second base layer 103 as well.

In an embodiment, the first residual film 375 may exist in the first area 1A. The first residual film 375 may be on the first insulating layer 111, and the first residual film 375 and the first connection electrode CM1 (see FIG. 2) may be formed of (or include) a same material and by a same process. However, the second connection line IL-B and the second connection electrode CM2 include a same material and are on a same layer, the second connection line IL-B is arranged on an upper surface of the first organic insulating layer 121, and thus the second residual film 377 may not exist in the structure of FIG. 7.

Figure 8:
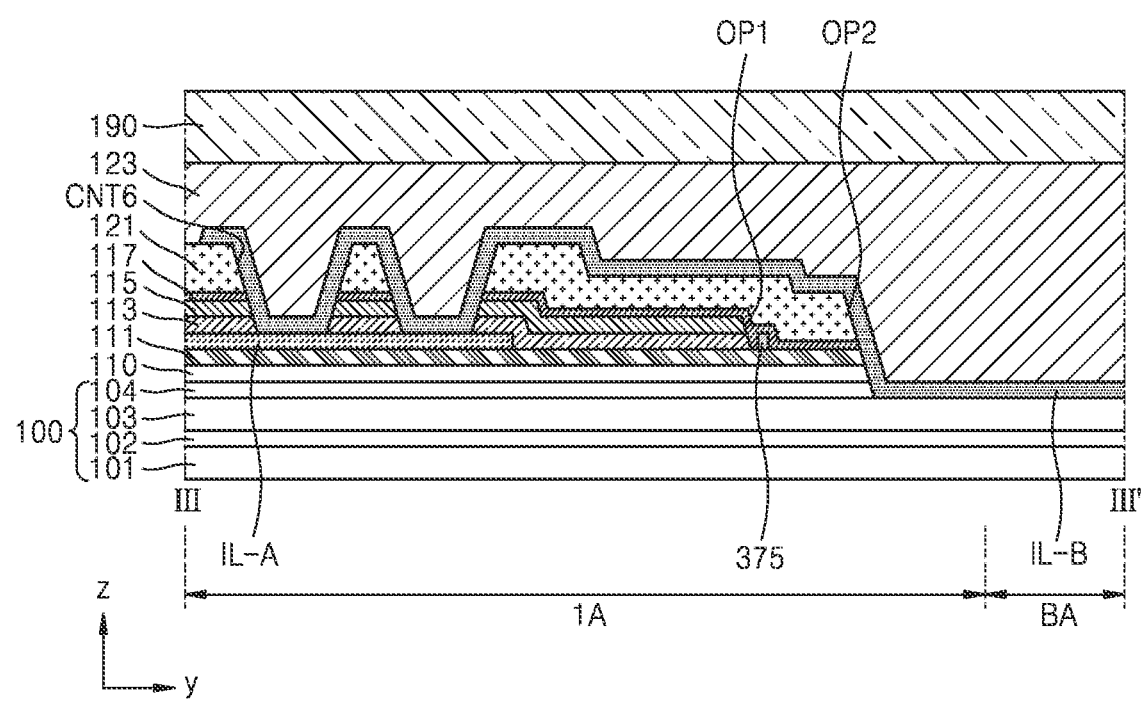
FIG. 8 is a schematic cross-sectional view of a display apparatus according to an embodiment.

FIG. 8 is a schematic cross-sectional view of a display apparatus according to an embodiment. The same reference symbols in FIGS. 5 and 8 denote the same elements, and thus, their descriptions are not repeated.

Referring to FIGS. 2, 3, 5, 6, and 8, the buffer layer 110, the first insulating layer 111, the second insulating layer 113, the third insulating layer 115, the protective layer 117, the first organic insulating layer 121, the second organic insulating layer 123, and the spacer 190 may be sequentially arranged on the substrate 100. However, at least one of the buffer layer 110, the first insulating layer 111, the second insulating layer 113, the third insulating layer 115, the protective layer 117, the first organic insulating layer 121, the second organic insulating layer 123, and the spacer 190 may be omitted.

In an embodiment, the first transmission line IL-A of the input line IL may be arranged in the first area 1A. Also, the second transmission line IL-B of the input line IL may be arranged in the bending area BA. As described above, the second transmission line IL-B may be arranged in the bending area BA, and at least a portion of the second transmission line IL-B may extend to the first area 1A. Therefore, at least a portion of the second transmission line IL-B may be arranged in the first area 1A The first transmission line IL-A may be arranged on the first insulating layer 111. For example, the first transmission line IL-A and the gate electrode GE (see FIG. 2) may include a same material and may be provided on a same layer. The second transmission line IL-B may be arranged on the first organic insulating layer 121. For example, the second transmission line IL-B and the second connection electrode CM2 (see FIG. 2) may include a same material and may be provided on a same layer.

The first transmission line IL-A may be electrically connected to the second transmission line IL-B through the sixth contact holes CNT6 defined in the second insulating layer 113, the third insulating layer 115, the protective layer 117, and the first organic insulating layer 121. For example, at least a portion of the first transmission line IL-A may be exposed through the sixth contact holes CNT6 defined in the second insulating layer 113, the third insulating layer 115, the protective layer 117, and the first organic insulating layer 121, and the second transmission line IL-B may be directly arranged on the first transmission line IL-A of which at least a portion is exposed. Therefore, the first transmission line IL-A may be electrically connected to the second transmission line IL-B.

In an embodiment, the second organic insulating layer 123 and/or the spacer 190 may be arranged on the second transmission line IL-B. However, one or more embodiments are not limited thereto. The third organic insulating layer 125 and/or the pixel-defining layer 180 may be further arranged between the second organic insulating layer 123 and the spacer 190.

Figure 9:
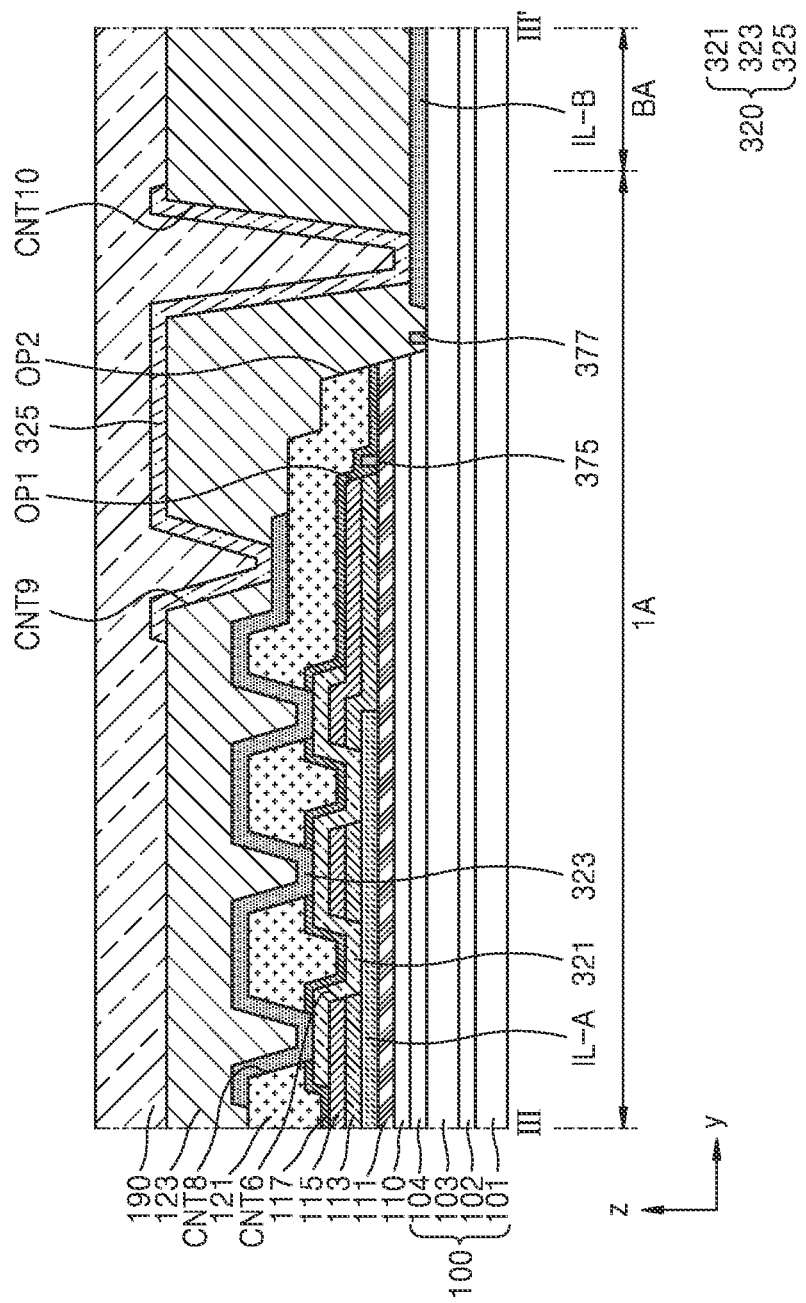
FIG. 9 is a schematic cross-sectional view of a display apparatus according to an embodiment.

FIG. 9 is a schematic cross-sectional view of a display apparatus according to an embodiment. The same reference symbols in FIGS. 5 and 9 denote the same elements, and thus, their descriptions are not repeated.

Referring to FIGS. 2, 3, 5, and 9, the buffer layer 110, the first insulating layer 111, the second insulating layer 113, the third insulating layer 115, the protective layer 117, the first organic insulating layer 121, the second organic insulating layer 123, and the spacer 190 may be sequentially arranged on the substrate 100. However, at least one of the buffer layer 110, the first insulating layer 111, the second insulating layer 113, the third insulating layer 115, the protective layer 117, the first organic insulating layer 121, the second organic insulating layer 123, and the spacer 190 may be omitted.

In an embodiment, the first transmission line IL-A of the input line IL may be arranged in the first area 1A. Also, the second transmission line IL-B of the input line IL may be arranged in the bending area BA. As described above, the second transmission line IL-B may be arranged in the bending area BA, and at least a portion of the second transmission line IL-B may extend to the first area 1A. Therefore, at least a portion of the second transmission line IL-B may be arranged in the first area 1A In an embodiment, the conductive pattern 320 may include a first conductive pattern 321, a second conductive pattern 323, and a third conductive pattern 325. The first conductive pattern 321, the second conductive pattern 323, and the third conductive pattern 325 may be arranged in the first area 1A.

The first transmission line IL-A may be arranged on the first insulating layer 111. For example, the first transmission line IL-A and the gate electrode GE (see FIG. 2) may include a same material and may be provided on a same layer. The second transmission line IL-B may be arranged on the second base layer 103. The second transmission line IL-B and the second connection electrode CM2 (see FIG. 2) may be formed of (or include) a same material and by a same process.

The first conductive pattern 321 may be arranged on the third insulating layer 115. The first conductive pattern 321 may be electrically connected to the first transmission line IL-A through the sixth contact holes CNT6 defined in the second insulating layer 113 and the third insulating layer 115. For example, at least a portion of the first transmission line IL-A may be exposed through the sixth contact holes CNT6 defined in the second insulating layer 113 and the third insulating layer 115, and the first conductive pattern 321 may be arranged on the first transmission line IL-A of which at least a portion is exposed. The first conductive pattern 321 and the first connection electrode CM1 (see FIG. 2) may include a same material and may be provided on a same layer.

The protective layer 117 and/or the first organic insulating layer 121 may be arranged on the first conductive pattern 321. Also, the second conductive pattern 323 may be arranged on the first organic insulating layer 121. The second conductive pattern 323 may be electrically connected to the first conductive pattern 321 through the eighth contact holes CNT8 defined in the protective layer 117 and/or the first organic insulating layer 121. For example, at least a portion of the first conductive pattern 321 may be exposed through the eighth contact holes CNT8 defined in the protective layer 117 and/or the first organic insulating layer 121, and the second conductive pattern 323 may be arranged on the first conductive pattern 321 of which at least a portion is exposed. The second conductive pattern 323 and the second connection electrode CM2 (see FIG. 2) may include a same material and be provided on a same layer.

The second organic insulating layer 123 may be arranged on the second conductive pattern 323, and the third conductive pattern 325 may be arranged on the second organic insulating layer 123. The third conductive pattern 325 may be electrically connected to the second conductive pattern 323 through a ninth contact hole CNT9 defined in the second organic insulating layer 123. For example, at least a portion of the second conductive pattern 323 may be exposed through the ninth contact hole CNT9 defined in the second organic insulating layer 123, and the third conductive pattern 325 may be arranged on the second conductive pattern 323 of which at least a portion is exposed. The third conductive pattern 325 and the pixel electrode 210 (see FIG. 2) may be formed of a same material and by a same process.

The third conductive pattern 325 may be electrically connected to the second transmission line IL-B through a tenth contact hole CNT10 defined in the second organic insulating layer 123. For example, at least one of the second transmission line IL-B may be exposed through the tenth contact hole CNT10 defined in the second organic insulating layer 123, and the third conductive pattern 325 may be arranged on the second transmission line IL-B of which at least a portion is exposed.

The first transmission line IL-A may be electrically connected to the first conductive pattern 321, the first conductive pattern 321 may be electrically connected to the second conductive pattern 323, the second conductive pattern 323 may be electrically connected to the third conductive pattern 325, and the third conductive pattern 325 may be electrically connected to the second transmission line IL-B. Therefore, the first transmission line IL-A may be electrically connected to the second transmission line IL-B through the first, second, and third conductive patterns 321, 323, and 325.

In an embodiment, the second insulating layer 113 and the third insulating layer 115 may have the first opening OP1 corresponding to the bending area BA. Also, the second barrier layer 104, the buffer layer 110, the first insulating layer 111, the protective layer 117, and the first organic insulating layer 121 may have the second opening OP2 corresponding to the bending area BA. In an embodiment, the width of the first opening OP1 may be greater than that of the second opening OP2. However, one or more embodiments are not limited thereto. Also, while an inorganic insulating material formed in the bending area BA is removed, at least a portion of the second base layer 103 may also be removed, and thus, the opening corresponding to the bending area BA may also be formed in the second base layer 103.

Figure 10:
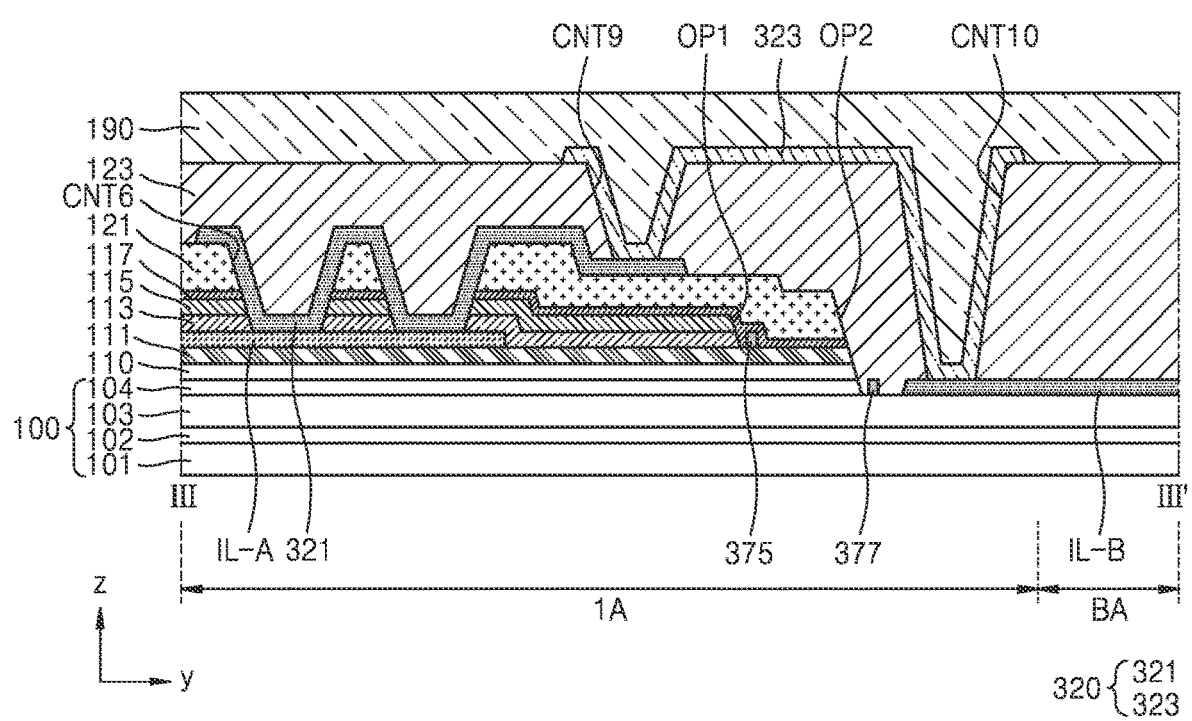
FIG. 10 is a schematic cross-sectional view of a display apparatus according to an embodiment.

FIG. 10 is a schematic cross-sectional view of a display apparatus according to an embodiment. The same reference symbols in FIGS. 5 and 10 denote the same elements, and their descriptions are not repeated.

Referring to FIGS. 2, 3, 5, and 10, the buffer layer 110, the first insulating layer 111, the second insulating layer 113, the third insulating layer 115, the protective layer 117, the first organic insulating layer 121, the second organic insulating layer 123, and the spacer 190 may be sequentially arranged on the substrate 100. However, at least one of the buffer layer 110, the first insulating layer 111, the second insulating layer 113, the third insulating layer 115, the protective layer 117, the first organic insulating layer 121, the second organic insulating layer 123, and the spacer 190 may be omitted.

In an embodiment, the first transmission line IL-A of the input line IL may be arranged in the first area 1A. Also, the second transmission line IL-B of the input line IL may be arranged in the bending area BA. As described above, the second transmission line IL-B may be arranged in the bending area BA, and at least a portion of the second transmission line IL-B may extend to the first area 1A. Therefore, at least a portion of the second transmission line IL-B may be arranged in the first area 1A.

In an embodiment, the conductive pattern 320 may include the first conductive pattern 321 and the second conductive pattern 323. The first conductive pattern 321 and the second conductive pattern 323 may be arranged in the first area 1A.

The first transmission line IL-A may be arranged on the first insulating layer 111. For example, the first transmission line IL-A and the gate electrode GE (see FIG. 2) may include a same material and may be provided on a same layer. The second transmission line IL-B may be arranged on the second base layer 103. The second transmission line IL-B and the second connection electrode CM2 (see FIG. 2) may be formed of a same material and by a same process.

The first conductive pattern 321 may be electrically connected to the first transmission line IL-A through the sixth contact holes CNT6 defined in the second insulating layer 113, the third insulating layer 115, the protective layer 117, and the first organic insulating layer 121. For example, at least a portion of the first transmission line IL-A may be exposed through the sixth contact holes CNT6 defined in the second insulating layer 113, the third insulating layer 115, the protective layer 117, and the first organic insulating layer 121, and the first conductive pattern 321 may be arranged on the first transmission line IL-A of which at least a portion is exposed. The first conductive pattern 321 and the second connection electrode CM2 (see FIG. 2) may include a same material and may be provided on a same layer.

The second organic insulating layer 123 may be arranged on the first conductive pattern 321, and the second conductive pattern 323 may be arranged on the second organic insulating layer 123. The second conductive pattern 323 may be electrically connected to the first conductive pattern 321 through the ninth contact hole CNT9 defined in the second organic insulating layer 123. For example, at least a portion of the first conductive pattern 321 may be exposed through the ninth contact hole CNT9 defined in the second organic insulating layer 123, and the second conductive pattern 323 may be arranged on the first conductive pattern 321 of which at least a portion is exposed. The second conductive pattern 323 and the pixel electrode 210 (see FIG. 2) may include a same material and may be provided on a same layer.

The second conductive pattern 323 may be electrically connected to the second transmission line IL-B through the tenth contact hole CNT10 defined in the second organic insulating layer 123. For example, at least a portion of the second transmission line IL-B may be exposed through the tenth contact hole CNT10 defined in the second organic insulating layer 123, and the second conductive pattern 323 may be arranged on the second transmission line IL-B of which at least a portion is exposed.

The first transmission line IL-A may be electrically connected to the first conductive pattern 321, the first conductive pattern 321 may be electrically connected to the second conductive pattern 323, and the second conductive pattern 323 may be electrically connected to the second transmission line IL-B. Therefore, the first transmission line IL-A may be electrically connected to the second transmission line IL-B through the first conductive pattern 321 and the second conductive pattern 323.

Figure 11:
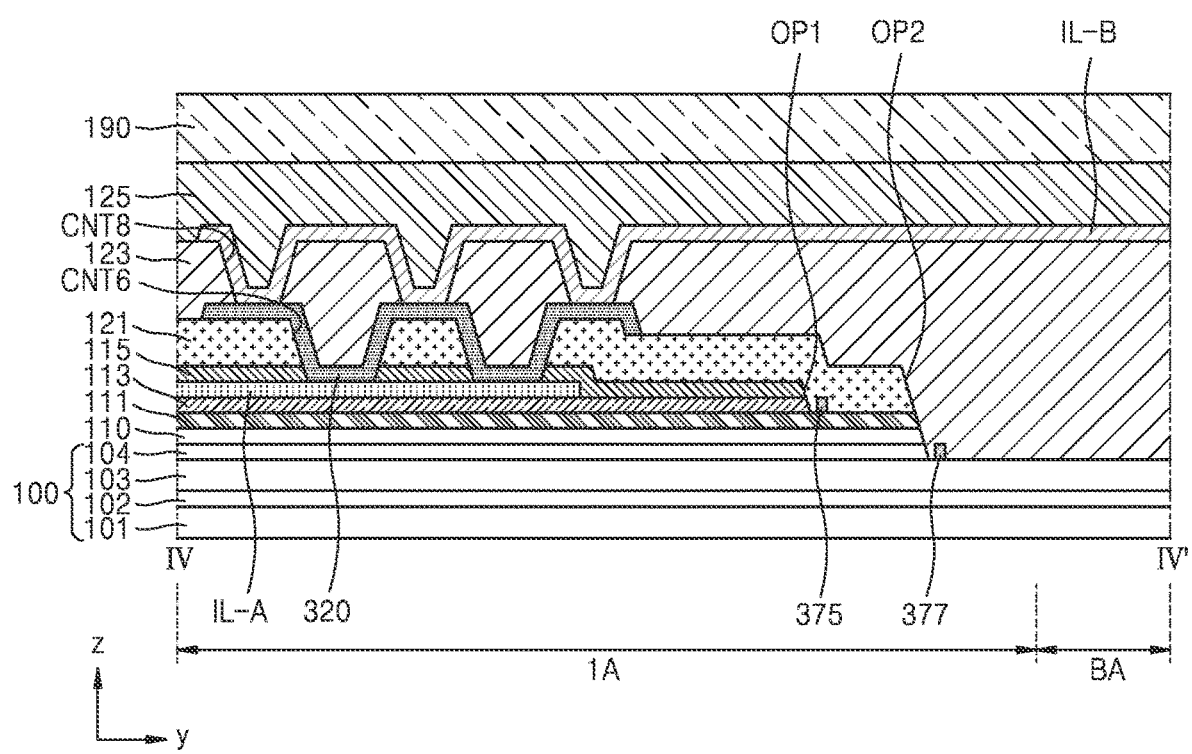
FIG. 11 is a schematic cross-sectional view of a display apparatus according to an embodiment.

FIG. 11 is a schematic cross-sectional view of a display apparatus according to an embodiment. The embodiment of FIG. 11 is different from the embodiment of FIG. 5 at least in that the first transmission line IL-A is arranged on the second insulating layer 113. The same reference symbols in FIGS. 5 and 11 denote the same elements, and thus, their descriptions are not repeated.

Referring to FIG. 11, the buffer layer 110, the first insulating layer 111, the second insulating layer 113, the third insulating layer 115, the protective layer 117, the first organic insulating layer 121, the second organic insulating layer 123, and the spacer 190 may be sequentially arranged on the substrate 100. However, at least one of the buffer layer 110, the first insulating layer 111, the second insulating layer 113, the third insulating layer 115, the protective layer 117, the first organic insulating layer 121, the second organic insulating layer 123, and the spacer 190 may be omitted.

In an embodiment, the first transmission line IL-A of the input line IL may be arranged in the first area 1A. Also, the second transmission line IL-B of the input line IL may be arranged in the bending area BA. As described above, the second transmission line IL-B may be arranged in the bending area BA, and at least a portion of the second transmission line IL-B may extend to the first area 1A. Therefore, at least a portion of the second transmission line IL-B may be arranged in the first area 1A.

In an embodiment, the first transmission line IL-A may be electrically connected to the second transmission line IL-B through the conductive pattern 320. In detail, the first transmission line IL-A may be electrically connected to the second transmission line IL-B through the conductive pattern 320 arranged in the first area 1A.

The first transmission line IL-A may be arranged on the second insulating layer 113. For example, the first transmission line IL-A and the upper electrode CE2 (see FIG. 2) may include a same material and may be provided on a same layer.

The conductive pattern 320 may be arranged on the first organic insulating layer 121. The conductive pattern 320 may be electrically connected to the first transmission line IL-A through the sixth contact holes CNT6 defined in the third insulating layer 115 and the first organic insulating layer 121. For example, at least a portion of the first transmission line IL-A may be exposed through the sixth contact holes CNT6 defined in the third insulating layer 115 and the first organic insulating layer 121, and the conductive pattern 320 may be arranged on the first transmission line IL-A of which at least a portion is exposed. The conductive pattern 320 and the second connection electrode CM2 (see FIG. 2) may include a same material and may be provided on a same layer.

The second organic insulating layer 123 may be arranged on the conductive pattern 320, and the second transmission line IL-B may be arranged on the second organic insulating layer 123. The second transmission line IL-B may be electrically connected to the conductive pattern 320 through the eighth contact holes CNT8 defined in the second organic insulating layer 123. For example, at least a portion of the conductive pattern 320 may be exposed through the eighth contact holes CNT8 defined in the second organic insulating layer 123, and the second transmission line IL-B may be arranged on the conductive pattern 320 of which at least a portion is exposed. Because the first transmission line IL-A of the input line IL is electrically connected to the conductive pattern 320 and the conductive pattern 320 is electrically connected to the second transmission line IL-B of the input line IL, the first transmission line IL-A of the input line IL may be electrically connected to the second transmission line IL-B of the input line IL.

FIGS. 12 to 16 are schematic cross-sectional views of a display apparatus according to an embodiment. In detail, FIGS. 12 to 16 are schematic cross-sectional views of the display apparatus, taken along line V-V' of FIG. 3 and correspond to schematic cross-sectional views of the pads 310 arranged in the peripheral area PA.

Figure 12:
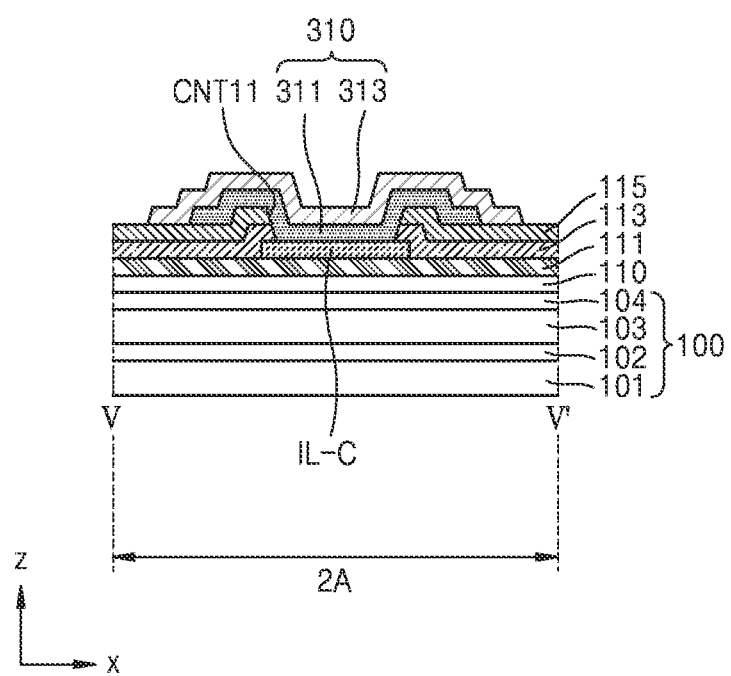
FIGS. 12 to 16 are schematic cross-sectional views of a display apparatus according to an embodiment.

Referring to FIGS. 2, 3, and 12, the buffer layer 110 and the first insulating layer 111 may be sequentially arranged on the substrate 100. The third transmission line IL-C of the input line IL may be arranged on the first insulating layer 111. The third transmission line IL-C and the gate electrode GE (see FIG. 2) may include a same material and may be provided on a same layer. However, one or more embodiments are not limited thereto. The third transmission line IL-C may be arranged on the second insulating layer 113. In this case, the third transmission line IL-C and the upper electrode CE2 (see FIG. 2) may include a same material and may be provided on a same layer. As described above with reference to FIG. 3, the third transmission line IL-C may be electrically connected to the second transmission line IL-B through the seventh contact hole CNT7 (see FIG. 3).

The second insulating layer 113 and the third insulating layer 115 may be arranged on the third transmission line IL-C. An eleventh contact hole CNT11 exposing at least a portion of the third transmission line IL-C may be defined in the second insulating layer 113 and the third insulating layer 115.

In an embodiment, the pad 310 may include a first pad electrode 311 and a second pad electrode 313. The first pad electrode 311 may be arranged on the third insulating layer 115. The first pad electrode 311 and the second connection electrode CM2 may be formed of (or include) a same material and by a same process. The first pad electrode 311 may be electrically connected to the third transmission line IL-C through the eleventh contact hole CNT11 defined in the second insulating layer 113 and the third insulating layer 115. The second pad electrode 313 may be arranged on the first pad electrode 311. For example, the second pad electrode 313 may be directly arranged on the first pad electrode 311. For example, an inorganic insulating layer and/or an organic insulating layer may not be arranged between the first pad electrode 311 and the second pad electrode 313. However, one or more embodiments are not limited thereto. The second pad electrode 311 and the third connection electrode CM3 (see FIG. 2) may be formed of (or include) a same material and by a same process.

Figure 13:
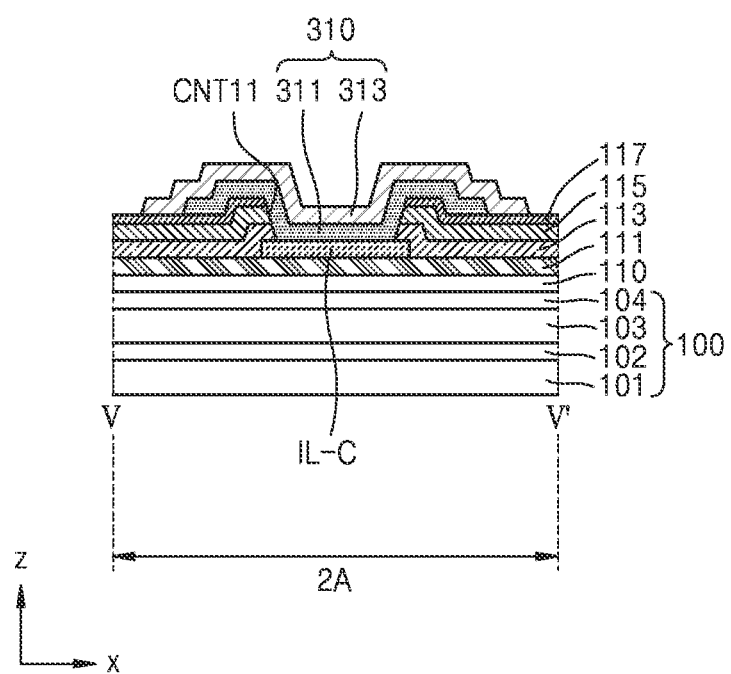

Referring to FIG. 13, the protective layer 117 may be further arranged between the third insulating layer 115 and the first pad electrode 311. The protective layer 117 may include silicon oxide, silicon oxynitride, silicon nitride, or the like. As the protective layer 117 is further arranged between the third insulating layer 115 and the first pad electrode 311, damage to metal patterns on the third insulating layer 115 may be prevented or reduced while the display apparatus 1 is manufactured.

Figure 14:
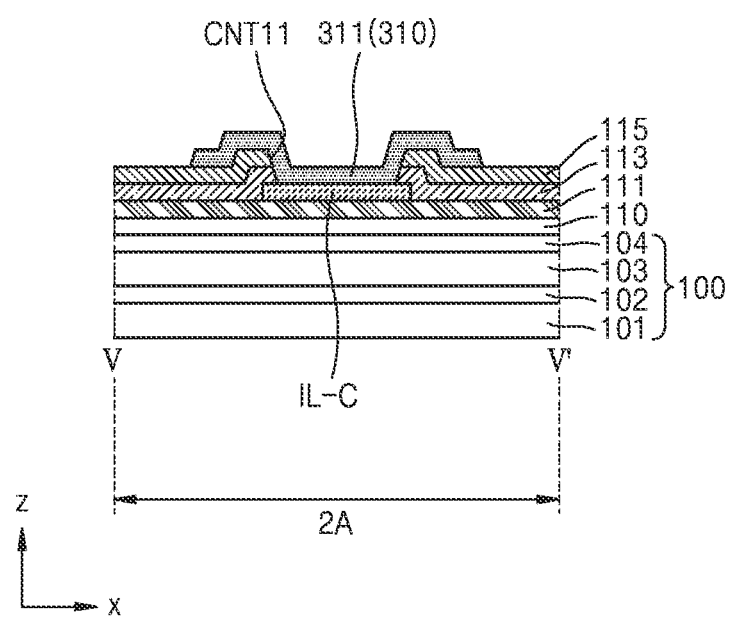

Referring to FIG. 14, in an embodiment, the pad 310 may include the first pad electrode 311. The first pad electrode 311 may be arranged on the third insulating layer 115. The first pad electrode 311 and the second connection electrode CM2 may be formed of (or include) a same material and by a same process. The first pad electrode 311 may be electrically connected to the third transmission line IL-C through the eleventh contact hole CNT11 defined in the second insulating layer 113 and the third insulating layer 115.

Figure 15:
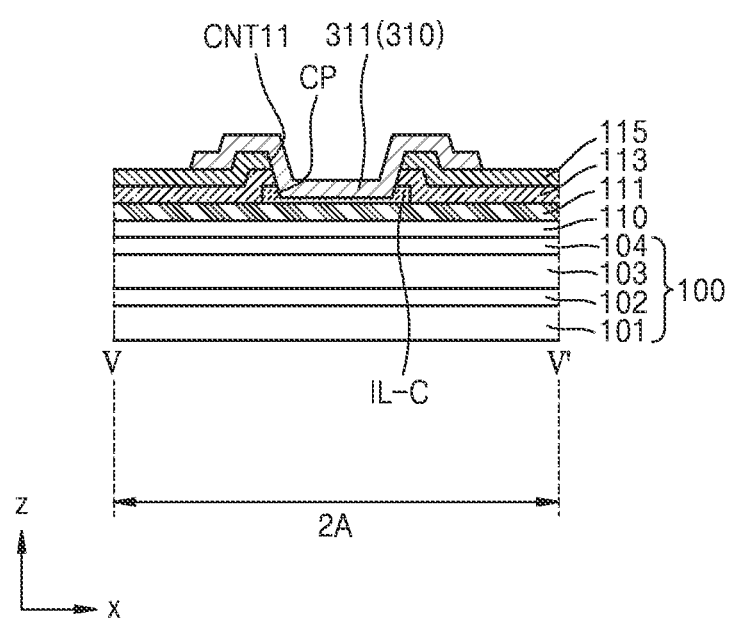

Referring to FIG. 15, the buffer layer 110 and the first insulating layer 111 may be sequentially arranged on the substrate 100. The third transmission line IL-C of the input line IL may be arranged on the first insulating layer 111. The second insulating layer 113 and the third insulating layer 115 may be arranged on the third transmission line IL-C. The eleventh contact hole CNT11 exposing at least a portion of the third transmission line IL-C may be defined in the second insulating layer 113 and the third insulating layer 115.

In an embodiment, a concave portion CP may be provided in the third transmission line IL-C. The concave portion CP formed in the third transmission line IL-C may be formed by removing at least a portion of the third transmission line IL-C overlapping the eleventh contact hole CNT11. However, one or more embodiments are not limited thereto. The third transmission line IL-C overlapping the eleventh contact hole CNT11 may be completely removed. In this case, a portion of a side surface of the third transmission line IL-C may be exposed.

The pad 310 may include the first pad electrode 311. The first pad electrode 311 may be arranged on the third insulating layer 115. The first pad electrode 311 may be formed by using the same material through the same process as the third connection electrode CM3 (see FIG. 2) described above with reference to FIG. 2. The first pad electrode 311 may be electrically connected to the third transmission line IL-C through the eleventh contact hole CNT11 defined in the second insulating layer 113 and the third insulating layer 115.

Figure 16:
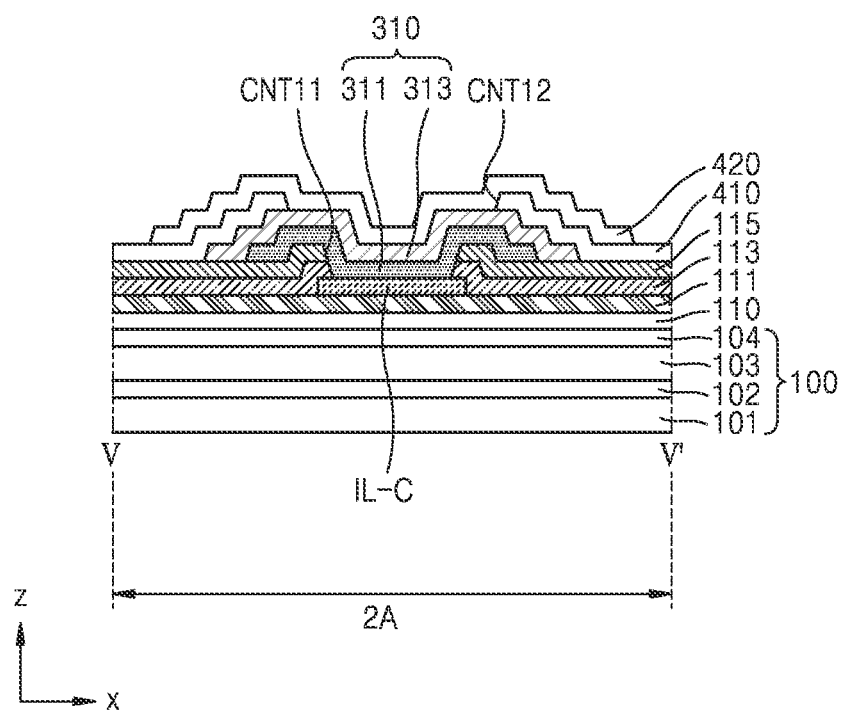

Referring to FIG. 16, a first touch insulating layer 410 and a first touch electrode 420 may be arranged on the pad 310. The first touch insulating layer 410 may be arranged on the second pad electrode 313. A twelfth contact hole CNT12 exposing at least a portion of the second pad electrode 313 may be defined in the first touch insulating layer 410. The first touch electrode 420 may be electrically connected to the second pad electrode 313 through the twelfth contact hole CNT12. In this case, it will be understood that the pad 310 includes the first touch electrode 420.

Figure 17:
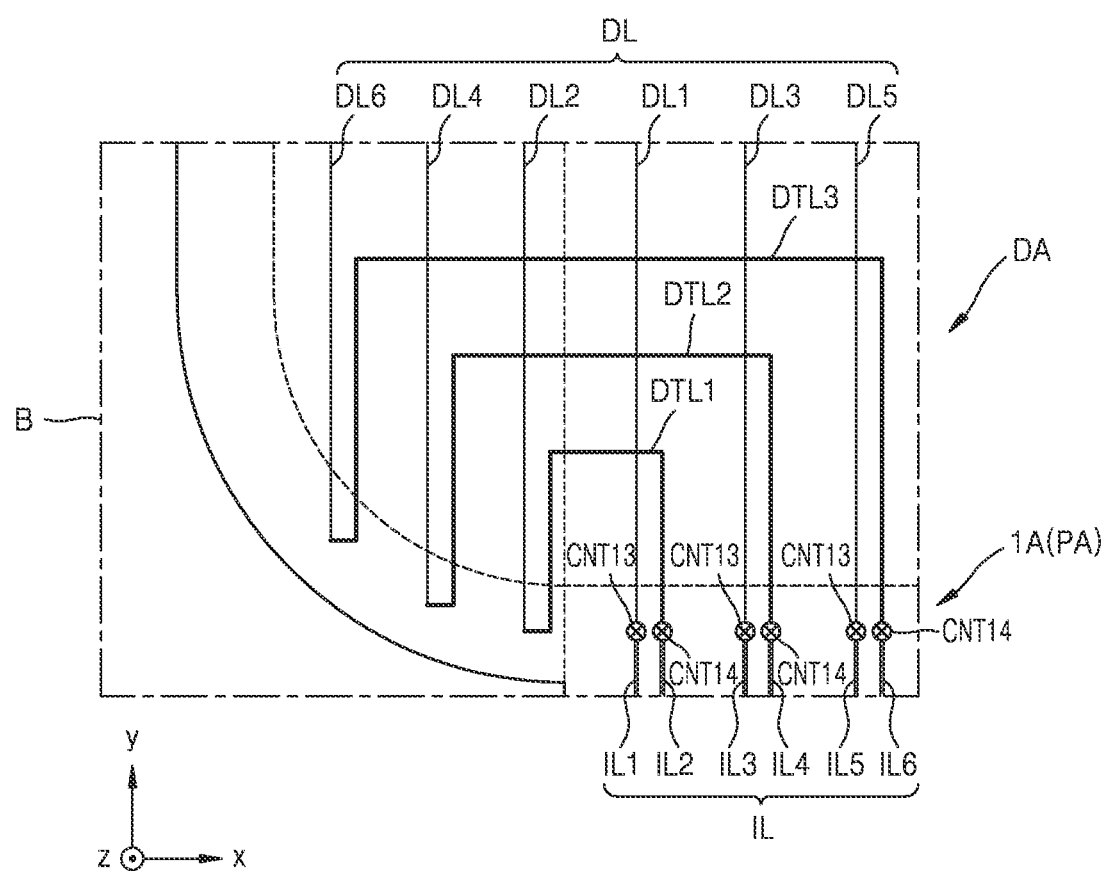
FIGS. 17 and 18 are schematic plan views of a display apparatus according to an embodiment.
Figure 18:
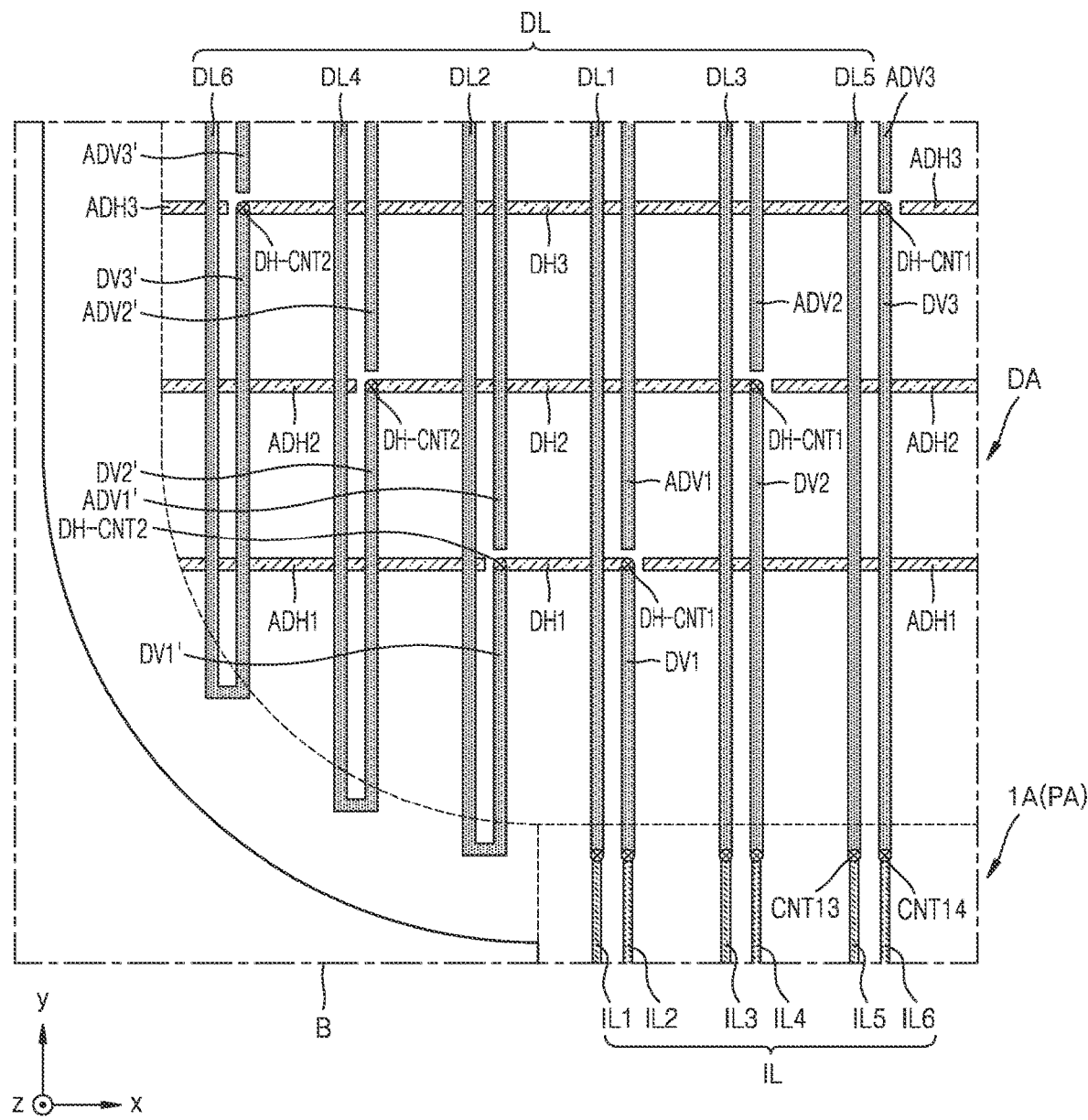

FIGS. 17 and 18 are schematic plan views of a display apparatus according to an embodiment. In detail, FIGS. 17 and 18 are schematic diagrams of enlarged region B of FIG. 1.

Referring to FIGS. 1, 2, 17, and 18, various signals may be applied to the display area DA. For example, a data signal for adjusting the brightness of each pixel P (see FIG. 1) may be applied to the display area DA. To this end, as illustrated in FIG. 17, data lines DL1 to DL6, which are arranged in the first direction (e.g., the x direction) to be substantially parallel to each other and extend in the second direction (e.g., the y direction) crossing the first direction (e.g., the x direction), may be arranged in the display area DA. According to necessity, as illustrated in FIG. 17, the data lines DL1 to DL6 may have shapes extending from the first area 1A to the display area DA. Various wires such as power lines (not illustrated) or scan lines (not illustrated) other than the data lines DL1 to DL6 may also be arranged in the display area DA.

As illustrated in FIGS. 1 and 3, the input line IL may be arranged in the peripheral area PA. In an embodiment, a first input line IL1 to a sixth input line IL6 may be arranged in the peripheral area PA. In this case, it will be understood that the input lines IL of FIGS. 1 and 3 include the first to sixth input lines IL1 to IL6. For example, the first to sixth input lines IL1 to IL6 may be one of the input lines IL. The first to sixth input lines IL1 to IL6 may be connected to the pad 310 (see FIG. 1) and receive the data signals.

As described above with reference to FIGS. 1 to 3, the data line DL may be arranged in the display area DA. In an embodiment, the first to sixth data lines DL1 to DL6 may be arranged in the display area DA. In this case, it will be understood that the data lines DL described with reference to FIGS. 1 to 3 include the first to sixth data lines DL1 to DL6. For example, the first to sixth data lines DL1 to DL6 may be one of the data lines DL. The first to sixth data lines DL1 to DL6 may be electrically connected to the first to sixth input lines IL1 to IL6, respectively, and may be configured to transmit the data signals to the pixels P (see FIG. 1) in the display area DA.

For convenience of explanation, FIGS. 17 and 18 illustrate that there are six input lines and six data lines, but one or more embodiments are not limited thereto. For example, the number of input lines and the number of data lines may each be equal to or greater than six.

The first to sixth input lines IL1 to IL6 may be sequentially arranged in a direction (e.g., a +x direction) from an edge of the first area 1A to the center of the first area 1A.

In an embodiment, the first input line IL1, the third input line IL3, and the fifth input line IL5, which are in odd lines, may be electrically connected to the first data line DL1, the third data line DL3, and the fifth data line DL5, which are adjacent to each other and continuously arranged. The first input line IL1, the third input line IL3, and the fifth input line IL5 may be integrally formed with corresponding ones among the first data line DL1, the third data line DL3, and the fifth data line DL5, and as illustrated in FIGS. 17 and 18, the first input line IL1, the third input line IL3, and the fifth input line IL5 may be electrically connected to corresponding ones of the first data line DL1, the third data line DL3, and the fifth data line DL5 through thirteenth contact holes CNT13, respectively. In the latter case, as illustrated in FIG. 18, the first data line DL1, the third data line DL3, and the fifth data line DL5 may be arranged on insulating layers covering the first input line IL1, the third input line IL3, and the fifth input line IL5. The first data line DL1, the third data line DL3, and the fifth data line DL5 may be configured to receive the data signals from the first input line IL1, the third input line IL3, and the fifth input line IL5. In this case, the thirteenth contact hole CNT13 may correspond to the fifth contact hole CNT5 described with reference to FIG. 3.

As illustrated in FIG. 17, the second input line IL2, the fourth input line IL4, and the sixth input line IL6, which are in even lines, may be electrically connected to the second data line DL2, the fourth data line DL4, and the sixth data line DL6, which are adjacent to each other and continuously arranged, through first to third data transmission lines DTL1 to DTL3. For example, the second data line DL2, the fourth data line DL4, and the sixth data line DL6 may be configured to receive the data signals from the second input line IL2, the fourth input line IL4, and the sixth input line IL6 through the first to third data transmission lines DTL1 to DTL3.

The first to third data transmission lines DTL1 to DTL3 may be arranged to pass a portion of the display area DA, which is adjacent to the peripheral area PA, for example, to pass the display area DA. The second input line IL2 may be electrically connected to the second data line DL2 through the first data transmission line DTL1, the fourth input line IL4 may be electrically connected to the fourth data line DL4 through the second data transmission line DTL2, and the sixth input line IL6 may be electrically connected to the sixth data line DL6 through the third data transmission line DTL3.

End portions of the first to third data transmission lines DTL1 to DTL3 may be electrically connected to the second, fourth, and sixth input lines IL2, IL4, and IL6, respectively, and the other end portions of the first to third data transmission lines DTL1 to DTL3 may be connected to the second, fourth, and sixth data lines DL2, DL4, and DL6, respectively. FIGS. 17 and 18 illustrate that fourteenth contact holes CNT14 are arranged in the peripheral area PA, but one or more embodiments are not limited thereto. For example, the fourteenth contact holes CNT14 may be arranged in the display area DA. In this case, the fourteenth contact hole CNT14 may correspond to the fifth contact hole CNT5 described with reference to FIG. 3.

Because of the above structure, the second input line IL2 may be configured to transmit the data signal to the second data line DL2, the fourth input line IL4 may be configured to transmit the data signal to the fourth data line DL4, and the sixth input line IL6 may be configured to transmit the data signal to the sixth data line DL6.

FIG. 18 illustrates in detail example configurations of the first to third data transmission lines DTL1 to DTL3.

As illustrated in FIG. 18, the second, fourth, and sixth input lines IL2, IL4, and IL6 may be electrically connected to the second, fourth, and sixth data lines DL2, DL4, and DL6 through the first to third data transmission lines DTL1 to DTL3. In this case, the first data transmission line DTL1 may include a first additional vertical connection line DV1', a first horizontal connection line DH1, and a first vertical connection line DV1. Similarly, the second data transmission line DTL2 may include a second additional vertical connection line DV2', a second horizontal connection line DH2, and a second vertical connection line DV2. The third data transmission line DTL3 may include a third additional vertical connection line DV3', a third horizontal connection line DH3, and a third vertical connection line DV3.

The first to third additional vertical connection lines DV1' to DV3' and the first to third vertical connection lines DV1 to DV3 may be arranged substantially parallel to the first to sixth data lines DL1 to DL6. The first horizontal connection line DH1 to the third horizontal connection line DH3 may extend in the first direction (the x direction) crossing the second direction (the y direction) in which the first to sixth data lines DL1 to DL6 extend.

The second, fourth, and sixth input lines IL2, IL4, and IL6 may be electrically connected to the first to third vertical connection lines DV1 to DV3 through the fourteenth contact holes CNT14, respectively. The first to third horizontal connection lines DH1 to DH3 may be electrically connected to the first to third vertical connection lines DV1 to DV3 through first connection contact holes DH-CNT1 located in end portions of the first to third horizontal connection lines DH1 to DH3, respectively. The first to third horizontal connection lines DH1 to DH3 may be electrically connected to the first to third additional vertical connection lines DV1' to DV3' through second connection contact holes DH-CNT2 located in the other end portions of the first to third horizontal connection lines DH1 to DH3, respectively. The first to third additional vertical connection lines DV1' to DV3' may be integrated with the second, fourth, and sixth data lines DL2, DL4, and DL6, respectively.

The first to sixth data lines DL1 to DL6, the first to third additional vertical connection lines DV1' to DV3', and the first to third vertical connection lines DV1 to DV3 may be arranged on a same layer. The first to third horizontal connection lines DH1 to DH3 and the first to sixth data lines DL1 to DL6 may be on different layers.

When viewed in a direction (e.g., the z direction) perpendicular to the substrate 100, the first horizontal connection line DH1 may cross the first data line DL1, the second horizontal connection line DH2 may cross the first to third data lines DL1 to DL3, and the third horizontal connection line DH3 may cross the first to fifth data lines DL1 to DL5. For example, the first horizontal connection line DH1 may at least partially overlap the first data line DL1, the second horizontal connection line DH2 may at least partially overlap the first to third data lines DL1 to DL3, and the third horizontal connection line DH3 may at least partially overlap the first to fifth data lines DL1 to DL5. Therefore, as described above, the first to third horizontal connection lines DH1 to DH3 may be arranged under the first to sixth data lines DL1 to DL6 not to contact data lines crossing the first to third horizontal connection lines DH1 to DH3. However, one or more embodiments are not limited thereto. The first to third horizontal connection lines DH1 to DH3 may be arranged above the first to sixth data lines DL1 to DL6.

As illustrated in FIG. 18, the display apparatus may further include dummy wires.

As illustrated in FIG. 18, the display apparatus may include a first auxiliary horizontal connection line ADH1 that is apart from the first horizontal connection line DH1 in the first direction (e.g., the x direction), is electrically insulated from the first horizontal connection line DH1 and the second data line DL2, and has the same extension axis as an extension axis of the first horizontal connection line DH1. In detail, the display apparatus may include the first auxiliary horizontal connection line ADH1 arranged on a side of the first horizontal connection line DH1 (e.g., a −x direction) and the first auxiliary horizontal connection line ADH1 arranged on another side of the first horizontal connection line DH1 (e.g., a +x direction). Likewise, the display apparatus may include a second auxiliary horizontal connection line ADH2 arranged on a side of the second horizontal connection line DH2 (e.g., the −x direction) and the second auxiliary horizontal connection line ADH2 arranged on another side of the second horizontal connection line DH2 (e.g., the +x direction), and may include a third auxiliary horizontal connection line ADH3 arranged on a side of the third horizontal connection line DH3 (e.g., the −x direction) and the third auxiliary horizontal connection line ADH3 arranged on another side of the third horizontal connection line DH3 (e.g., the +x direction).

To this end, a structural difference between the pixels P (see FIG. 1), through which the first to third horizontal connection lines DH1 to DH3 pass, and the pixels P (see FIG. 1), through which the first to third horizontal connection lines DH1 to DH3 do not pass, may be reduced. As a result, in case that a same electrical signal is applied to the pixels P see FIG. 1), the difference in the brightness of the pixels P (see FIG. 1) may decrease, and thus, a display apparatus capable of displaying a high-quality image may be realized. The first to third auxiliary horizontal connection lines ADH1 to ADH3 and the first to third horizontal connection lines DH1 to DH3 may be arranged on a same layer. Also, the first to third auxiliary horizontal connection lines ADH1 to ADH3 may be apart from the first to third horizontal connection lines DH1 to DH3 in the first direction (e.g., the x direction), respectively.

The display apparatus may include a first additional auxiliary vertical connection line ADV1' that is apart from the first additional vertical connection line DV1', is electrically insulated from the first additional vertical connection line DV1' and the first horizontal connection line DH1, has the same extension axis as an extension axis of the first additional vertical connection line DV1', and thus is arranged on a side of the first additional vertical connection line DV1' (e.g., the +y direction). Likewise, the display apparatus may include a second additional auxiliary vertical connection line ADV2', which is arranged on a side of the second additional vertical connection line DV2' (e.g., the +y direction), and a third additional auxiliary vertical connection line ADV3', which is arranged on a side of the third additional vertical connection line DV3' (e.g., the +y direction). The first to third additional auxiliary vertical connection lines ADV1' to ADV3' and the first to third additional vertical connection lines DV1' to DV3' may be arranged on a same layer. Also, the first to third additional auxiliary vertical connection lines ADV1' to ADV3' may be apart from the first to third additional vertical connection lines DV1' to DV3' in the second direction (the y direction), respectively.

The display apparatus may include a first auxiliary vertical connection line ADV1 that is apart from the first vertical connection line DV1, is electrically insulated from the first vertical connection line DV1 and the first horizontal connection line DH1, has the same extension axis as the extension axis of the first vertical connection line DV1, and thus is arranged on a side of the first vertical connection line DV1 (e.g., the +y direction). Likewise, the display apparatus may include a second auxiliary vertical connection line ADV2, which is arranged on a side of the second vertical connection line DV2 (the +y direction), and a third auxiliary vertical connection line ADV3, which is arranged on a side of the third vertical connection line DV3 (e.g., the +y direction). The first to third auxiliary vertical connection lines ADV1 to ADV3 and the first to third vertical connection lines DV1 to DV3 may be arranged on a same layer. Also, the first to third auxiliary vertical connection lines ADV1 to ADV3 may be apart from the first to third vertical connection lines DV1 to DV3 in the second direction (the y direction), respectively.

To this end, the structural difference between the pixels P, through which the first to third vertical connection lines DV1 to DV3 pass, and the pixels P, through which the first to third additional vertical connection lines DV1' to DV3' do not pass, may decrease. The structural difference between the pixels P, through which the first to third vertical connection lines DV1 to DV3 pass, and the pixels P, through which the first to third vertical connection lines DV1 to DV3 do not pass, may decrease. As a result, in case that a same electrical signal is applied to the pixels P, the difference in the brightness of the pixels P may be reduced, and a display apparatus capable of displaying a high-quality image may be realized.

However, one or more embodiments are not limited thereto. For example, although not illustrated, each of the second, fourth, and sixth input lines IL2, IL4, and IL6, which are in even lines, may be directly and electrically connected to the data line.

Figure 19:
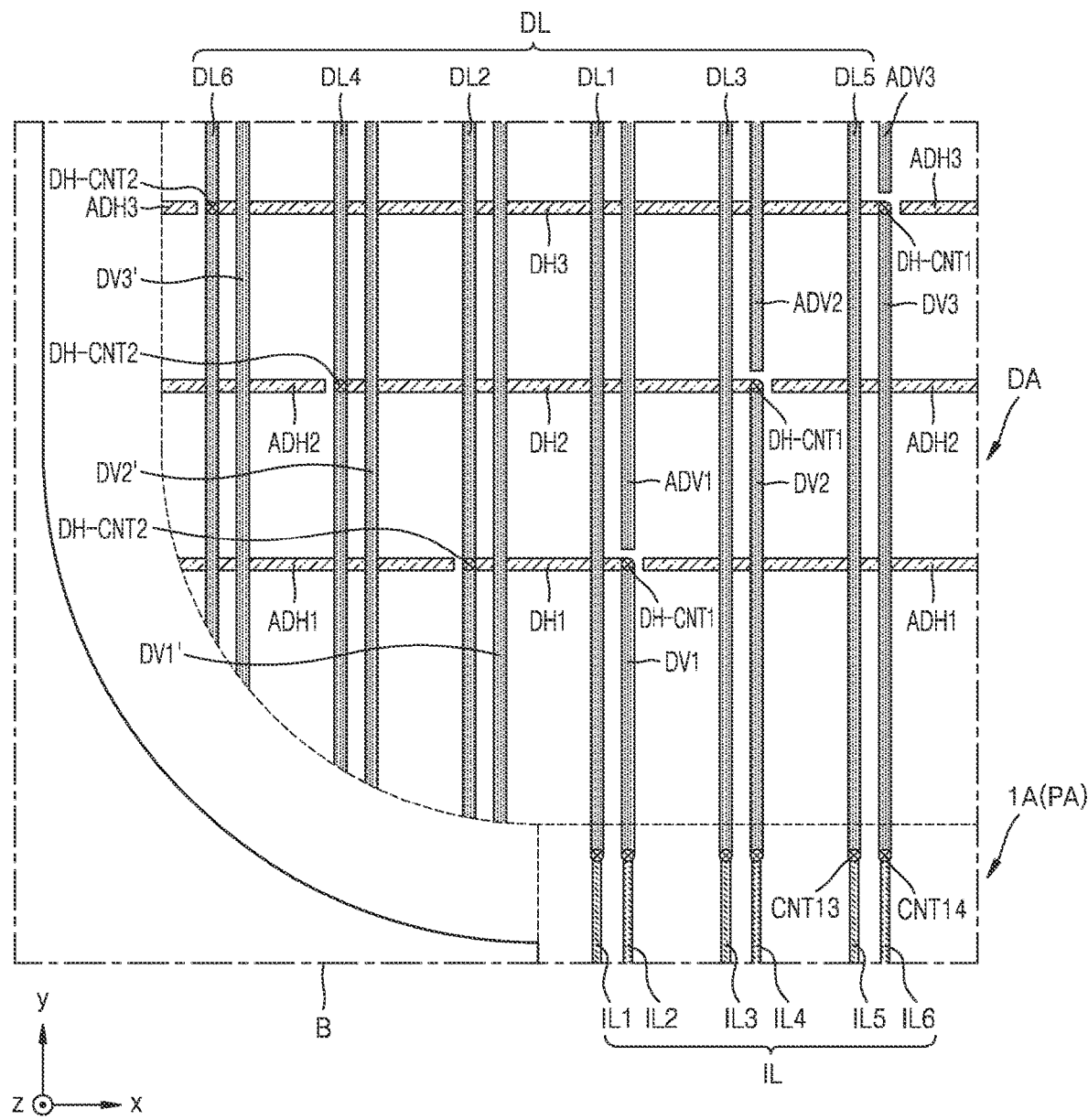
FIG. 19 is a schematic plan view of a display apparatus according to an embodiment.

FIG. 19 is a schematic plan view of a display apparatus according to an embodiment. The embodiment of FIG. 19 is different from the embodiments of FIGS. 17 and 18 at least in that the first to third horizontal connection lines DH1 to DH3 are electrically connected to corresponding ones of the second, fourth, and sixth data lines DL2, DL4, and DL6 through a contact hole, in the display area DA. The same reference symbols in FIGS. 17 to 19 denote the same elements, and thus, their descriptions are not repeated.

Referring to FIG. 19, in an embodiment, the first to third horizontal connection lines DH1 to DH3 may be electrically connected to corresponding ones of the first to third vertical connection lines DV1 to DV3 through the first connection contact holes DH-CNT1 arranged on end portions of the first to third horizontal connection lines DH1 to DH3 (e.g., the +x direction), respectively. Also, the first to third horizontal connection lines DH1 to DH3 may be electrically connected to corresponding ones of the second, fourth, and sixth data lines DL2, DL4, and DL6 through second connection contact holes DH-CNT2 arranged on the other end portions of the first to third horizontal connection lines DH1 to DH3 (e.g., the −x direction), respectively. To this end, the second, fourth, and sixth data lines DL2, DL4, and DL6 may be configured to receive data signals from the second, fourth, and sixth input lines IL2, IL4, and IL6.

In an embodiment, the first to third horizontal connection lines DH1 to DH3 may include a same material and may be provided on a same layer. The first to third vertical connection lines DV1 to DV3 may include a same material and may be provided on a same layer. Also, the second, fourth, and sixth data lines DL2, DL4, and DL6 may include a same material and may be provided on a same layer. Hereinafter, the first horizontal connection line DH1, the first vertical connection line DV1, and the second data line DL2 are mainly described, but the descriptions thereof may be identically applied to lines respectively corresponding thereto.

In an embodiment, the first horizontal connection line DH1 and the first vertical connection line DV1 may be on different layers. For example, the first horizontal connection line DH1 may be arranged on the third insulating layer 115 (see FIG. 2) described with reference to FIG. 2. For example, the first horizontal connection line DH1 and the first connection electrode CM1 (see FIG. 2) may include a same material and may be provided on a same layer. Also, the first vertical connection line DV1 may be arranged on the first organic insulating layer 12 (see FIG. 2) described with reference to FIG. 2. For example, the first vertical connection line DV1 and the second connection electrode CM2 (see FIG. 2) may include a same material and may be provided on a same layer.

Also, in an embodiment, the first horizontal connection line DH1 and the second data line DL2 may be on different layers. For example, the first horizontal connection line DH1 may be arranged on the third insulating layer 115 (see FIG. 2) described with reference to FIG. 2. For example, the first horizontal connection line DH1 and the first connection electrode CM1 (see FIG. 2) may include a same material and may be provided on a same layer. Also, the second data line DL2 may be arranged on the first organic insulating layer 12 (see FIG. 2) described with reference to FIG. 2. For example, the second data line DL2 and the second connection electrode CM2 (see FIG. 2) may include a same material and may be provided on a same layer. For example, the first horizontal connection line DH1 extending in the first direction (the x direction) and the first connection electrode CM1 (see FIG. 2) may include a same material and may be provided on a same layer, and the first vertical connection line DV1 and the second data line DL2, which extend in the second direction (the y direction) crossing the first direction (the x direction), and the second connection electrode CM2 (see FIG. 2) may include a same material and may be provided on a same layer. However, one or more embodiments are not limited thereto. For example, the first horizontal connection line DH1 and the second connection electrode CM2 (see FIG. 2) may include a same material and may be provided on a same layer, and the first vertical connection line DV1, the second data line DL2, and the first connection electrode CM1 (see FIG. 2) may include a same material and may be provided on a same layer.

In an embodiment, the first horizontal connection line DH1 and the first vertical connection line DV1 may be on different layers. For example, the first horizontal connection line DH1 may be arranged on the first organic insulating layer 121 (see FIG. 2) described with reference to FIG. 2. For example, the first horizontal connection line DH1 and the second connection electrode CM2 (see FIG. 2) may include a same material and may be provided on a same layer. Also, the first vertical connection line DV1 may be arranged on the second organic insulating layer 123 (see FIG. 2) described with reference to FIG. 2. For example, the first vertical connection line DV1 and the third connection electrode CM3 (see FIG. 2) may include a same material and may be provided on a same layer as. Also, the first horizontal connection line DH1 and the second data line DL2 may be on different layers. For example, the first horizontal connection line DH1 may be arranged on the first organic insulating layer 121 (see FIG. 2) described with reference to FIG. 2. For example, the first horizontal connection line DH1 may include the same material on the same layer as the second connection electrode (CM2 of FIG. 2). Also, the second data line DL2 may be arranged on the second organic insulating layer (123 of FIG. 2) described with reference to FIG. 2. For example, the second data line DL2 and the third connection electrode CM3 (see FIG. 2) may include a same material and may be provided on a same layer. For example, the first horizontal connection line DH1 extending in the first direction (e.g., the x direction) and the second connection electrode CM2 (see FIG. 2) may include a same material and may be provided on a same layer, and the first vertical connection line DV1 and the data line DL2 extending in the second direction (e.g., the y direction) crossing the first direction (e.g., the x direction) and the third connection electrode CM3 (see FIG. 2) may include a same material and be provided on a same layer. However, one or more embodiments are not limited thereto. For example, the first horizontal connection line DH1 and the third connection electrode CM3 (see FIG. 2) may include a same material and may be provided on a same layer, and the first vertical connection line DV1, the data line DL2, and the second connection electrode CM2 (see FIG. 2) may include a same material and may be provided on a same layer.

The first additional vertical connection line DV1', the second additional vertical connection line DV2', and the third additional vertical connection line DV3' may not be electrically connected to the data lines or the horizontal connection lines. For example, the first additional vertical connection line DV1', the second additional vertical connection line DV2', and the third additional vertical connection line DV3' may be electrically connected to the power supply line. However, one or more embodiments are not limited thereto. The first additional vertical connection line DV1', the second additional vertical connection line DV2', and the third additional vertical connection line DV3' crossing the first, second, or third horizontal connection line DH1, DH2, or DH3 may be omitted. However, to make the pixels P, through which the first data line DL1 and the first vertical connection line DV1 pass, the pixels P, through which the third data line DL3 and the second vertical connection line DV2 pass, and the pixels P, through which the fifth data line DL5 and the third vertical connection line DV3 pass, have the structures that are the same as or similar to the structure of the pixels P, through which the second, fourth, and sixth data lines DL2, DL4, and DL6 pass, as much as possible, the first additional vertical connection line DV1' may pass the pixels P through which the second data line DL2 passes, the second additional vertical connection line DV2' may pass the pixels P through which the fourth data line DL4 passes, and the third additional vertical connection line DV3' may pass the pixels P through which the sixth data line DL6 passes. To this end, a display apparatus capable of displaying a high-quality image may be realized.

As illustrated in FIG. 19, the display apparatus according to the embodiment may include the first auxiliary horizontal connection line ADH1 that is apart from the first horizontal connection line DH1, is electrically insulated from the first horizontal connection line DH1 and the second data line DL2, and has the same extension axis as the extension axis of the first horizontal connection line DH1. In particular, the display apparatus may include the first auxiliary horizontal connection line ADH1 that is on a side of the first horizontal connection line DH1 (the −x direction) and the first auxiliary horizontal connection line ADH1 that is on another side of the first horizontal connection line DH1 (the +x direction). Likewise, the display apparatus may include the second auxiliary horizontal connection line ADH2 that is on a side of the second horizontal connection line DH2 (e.g., the −x direction) and the second auxiliary horizontal connection line ADH2 that is on another side of the second horizontal connection line DH2 (e.g., the +x direction), and may include the third auxiliary horizontal connection line ADH3 that is on a side of the third horizontal connection line DH3 (e.g., the −x direction) and the third auxiliary horizontal connection line ADH3 that is on another side of the third horizontal connection line DH3 (e.g., the +x direction). The first to third auxiliary horizontal connection lines ADH1 to ADH3 may be respectively apart from the first to third horizontal connection lines DH1 to DH3 in the first direction (e.g., the x direction).

To this end, the structural difference between the pixels P, through which the first to third horizontal connection lines DH1 to DH3 pass, and the pixels P, through which the first to third horizontal connection lines DH1 to DH3 do not pass, may be reduced. As a result, in case that a same electrical signal is applied to the pixels P, the difference in the brightness of the pixels P may decrease, and thus, a display apparatus capable of displaying a high-quality image may be realized. The first to third auxiliary horizontal connection lines ADH1 to ADH3 and the first to third horizontal connection lines DH1 to DH3 may be on a same layer.

The display apparatus according to the embodiment may include the first auxiliary vertical connection line ADV1 that is apart from the first vertical connection line DV1, is electrically insulated from the first vertical connection line DV1 and the first horizontal connection line DH1, has the same extension axis as the extension axis of the first vertical connection line DV1, and thus is arranged on a side of the first vertical connection line DV1 (the +y direction). Likewise, the display apparatus may include the second auxiliary vertical connection line ADV2 that is on a side of the second vertical connection line DV2 (the +y direction) and the third auxiliary vertical connection line ADV3 that is on a side of the third vertical connection line DV3 (+y direction). The first to third auxiliary vertical connection lines ADV1 to ADV3 and the first to third vertical connection lines DV1 to DV3 may be on a same layer. Also, the first to third auxiliary vertical connection lines ADV1 to ADV3 may be apart from the first to third vertical connection lines DV1 to DV3 in the second direction (the y direction), respectively.

To this end, the structural difference between the pixels, through which the first to third vertical connection lines DV1 to DV3 pass, and the pixels, through which the first to third vertical connection lines DV1 to DV3 do not pass, may decrease. As a result, in case that a same electrical signal is applied to the pixels, the difference in the brightness of the pixels may be reduced, and thus, a display apparatus capable of displaying a high-quality image may be realized.

FIGS. 20 to 29 are schematic cross-sectional views of a method of manufacturing a display apparatus, according to an embodiment.

Hereinafter, the method of manufacturing the display apparatus is sequentially described with reference to FIGS. 20 to 29.

Referring to FIGS. 1, 2, 3, 5, and 20 to 29, the method of manufacturing the display apparatus may include preparing the substrate 100 including the first area 1A, the bending area BA, and the second area 2A, forming inorganic insulating layers (e.g., the second insulating layer 113 and the third insulating layer 115) on the substrate 100 including the first area 1A, the bending area BA, and the second area 2A, forming the first organic insulating layer 121, in which a first contact hole (e.g., the fifteenth contact hole CNT15) exposing at least a portion of the inorganic insulating layer is defined, on the inorganic insulating layer in the first area 1A and forming the via layer 122, in which a second contact hole (e.g., the sixteenth contact hole CNT16) exposing at least a portion of the inorganic insulating layer is defined, on the inorganic insulating layer in the second area 2A, and forming a third contact hole (e.g., the seventeenth contact hole CNT17) by etching the inorganic insulating layer exposed through the first contact hole, and forming a fourth contact hole (e.g., the eighteenth contact hole CNT18) by etching the inorganic insulating layer exposed through the second contact hole.

Figure 20:
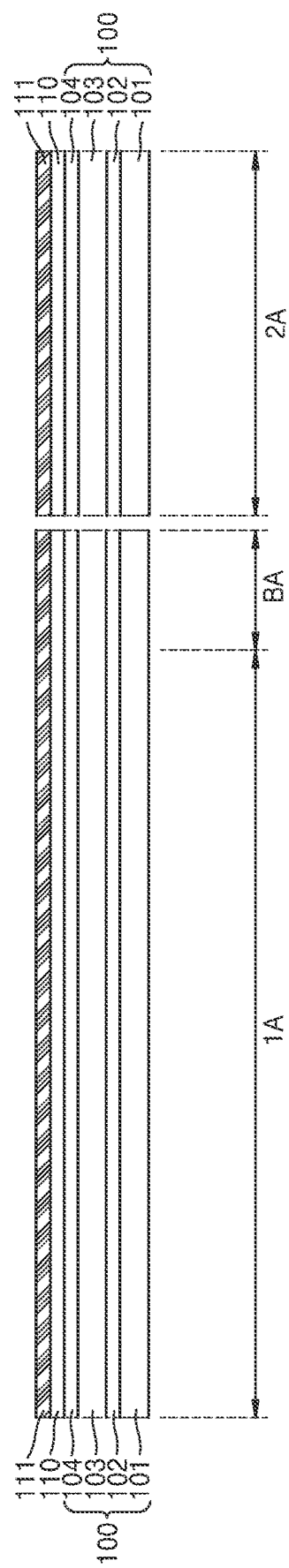
FIGS. 20 to 29 are schematic cross-sectional views illustrating a method of manufacturing a display apparatus, according to an embodiment.

Referring to FIG. 20, the buffer layer 110 and the first insulating layer 111 may be formed on the substrate 100 including the first area 1A, the bending area BA, and the second area 2A. As described above with reference to FIG. 2, the substrate 100 may include the first base layer 101, the first barrier layer 102, the second base layer 103, and the second barrier layer 104 that are sequentially stacked.

Figure 21:
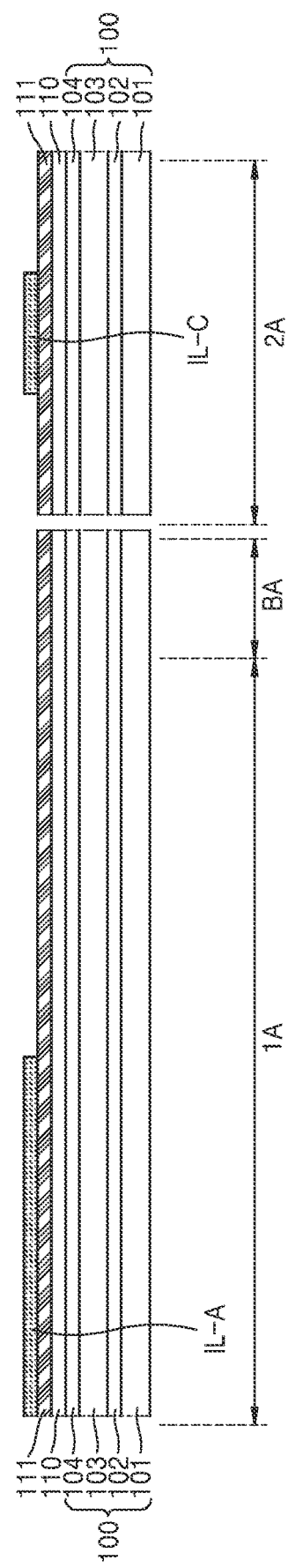

Referring to FIG. 21, the first transmission line IL-A and the third transmission line IL-C may be formed on the substrate 100. In detail, the first transmission line IL-A may be formed on the first insulating layer 111 in the first area 1A, and the third transmission line IL-C may be formed on the first insulating layer 111 in the second area 2A.

In an embodiment, the first transmission line IL-A and the third transmission line IL-C may be formed on a same layer. However, one or more embodiments are not limited thereto. The first transmission line IL-A and the third transmission line IL-C may be formed on different layers. For example, the first transmission line IL-A may be formed on the first insulating layer 111, and the third transmission line IL-C may be formed on the second insulating layer 113 described below, or vice versa.

Figure 22:
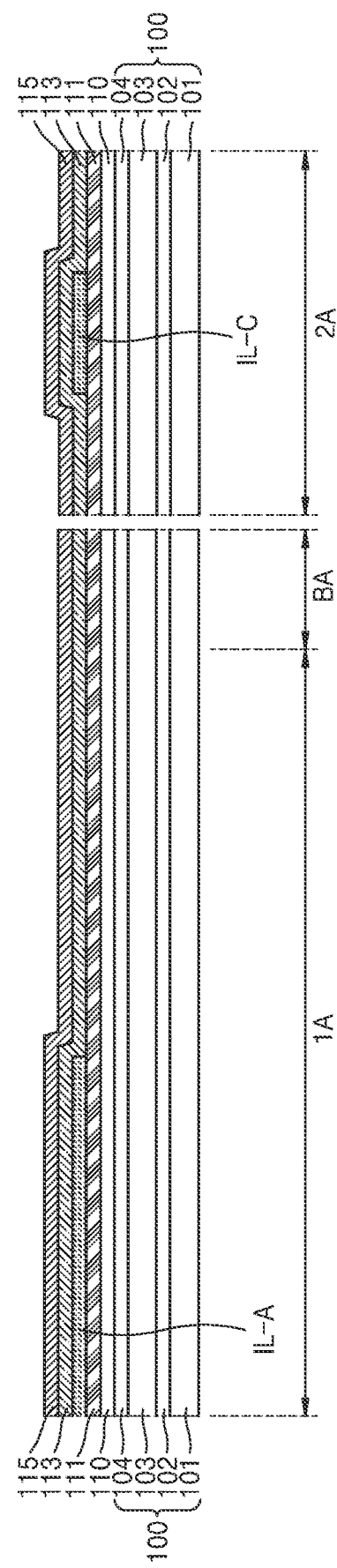

Referring to FIG. 22, the inorganic insulating layers (e.g., the second insulating layer 113 and the third insulating layer 115) may be formed on the substrate 100. In detail, the second insulating layer 113 and the third insulating layer 115 may be formed in the first area 1A, the bending area BA, and the second area 2A. For example, the second insulating layer 113 and the third insulating layer 115 may cover the first transmission line IL-A and the third transmission line IL-C formed on the first insulating layer 111.

Figure 23:
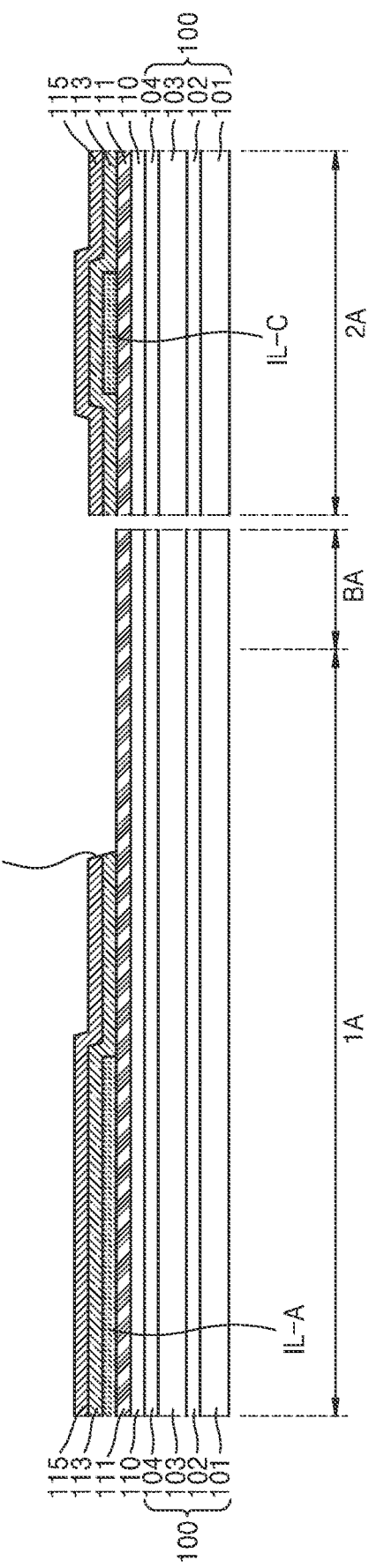

Referring to FIG. 23, at least a portion of the inorganic insulating layers (e.g., the second insulating layer 113 and the third insulating layer 115) may be etched to form a first opening (e.g., a third opening OP3) corresponding to the bending area BA. For example, at least portions of the second insulating layer 113 and the third insulating layer 115 may be etched to form the third opening OP3 corresponding to the bending area BA.

Figure 24:
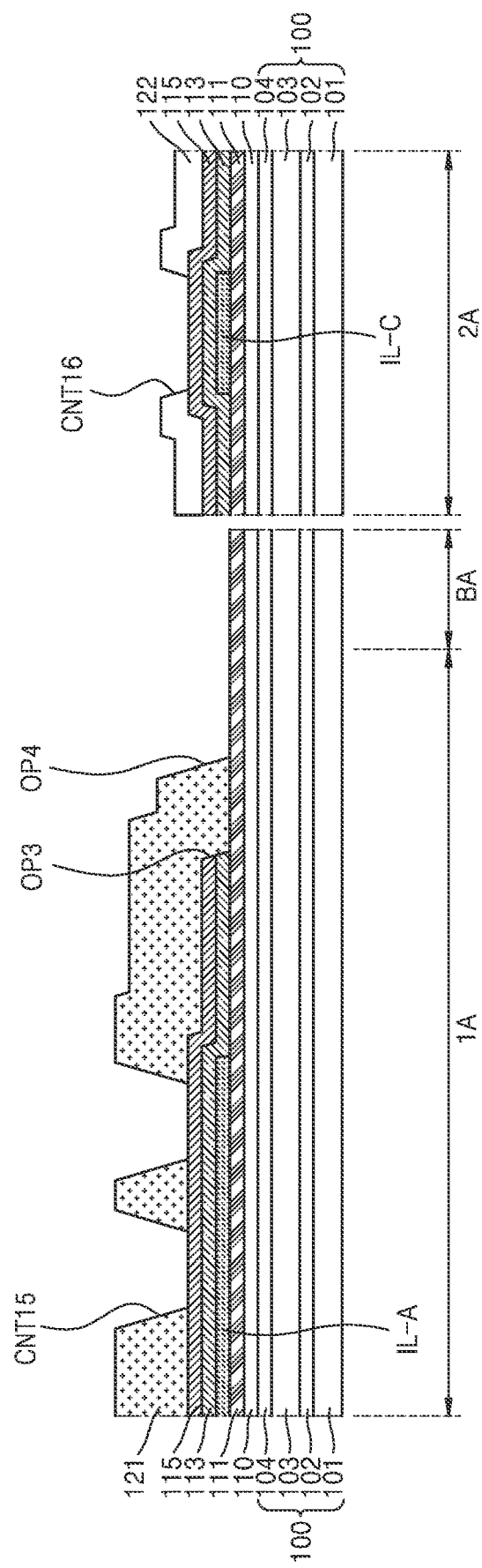

Referring to FIG. 24, the first organic insulating layer 121 and the via layer 122 may be formed on the inorganic insulating layers (e.g., the second insulating layer 113 and the third insulating layer 115). In this case, the first organic insulating layer 121 may be arranged in the first area 1A, and the via layer 122 may be arranged in the second area 2A.

The first organic insulating layer 121 may be directly formed on the third insulating layer 115. Also, because the third opening OP3 corresponding to the bending area BA is defined in the second insulating layer 113 and the third insulating layer 115, the first organic insulating layer 121 may be directly formed on the first insulating layer 111. The via layer 122 may be directly formed on the third insulating layer 115. However, one or more embodiments are not limited thereto. FIG. 24 illustrates that the first organic insulating layer 121 and the via layer 122 are directly formed on the third insulating layer 115, but the first organic insulating layer 121 and the via layer 122 may be directly formed on the second insulating layer 113.

In the first organic insulating layer 121, the first contact hole (e.g., the fifteenth contact hole CNT15) exposing at least a portion of the third insulating layer 115 may be defined. Also, in the first organic insulating layer 121, a second opening (e.g., a fourth opening OP4) exposing at least a portion of the first insulating layer 111 may be defined. In the via layer 122, the second contact hole (e.g., the sixteenth contact hole CNT16) exposing at least a portion of the third insulating layer 115 may be defined.

In a direction perpendicular to the substrate 100, a thickness of the first organic insulating layer 121 may be greater than that of the via layer 122. For example, the thickness of the first organic insulating layer 121 may be about twice the thickness of the via layer 122. However, one or more embodiments are not limited thereto.

In an embodiment, the first organic insulating layer 121 and the via layer 122 may be simultaneously formed by using a halftone mask. For example, after a material for forming the first organic insulating layer 121 and the via layer 122 is entirely spread, the first organic insulating layer 121 may be formed in the first area 1A, and the via layer 122 may be formed in the second area 2A by using the halftone mask. In this case, the thickness of the first organic insulating layer 121 may be greater than that of the via layer 122 in the direction perpendicular to the substrate 100. For example, the thickness of the first organic insulating layer 121 may be about twice the thickness of the via layer 122. However, one or more embodiments are not limited thereto.

Although not illustrated, before the first organic insulating layer 121 and the via layer 122 are formed on the inorganic insulating layers (e.g., the second insulating layer 113 and the third insulating layer 115), forming the protective layer 117 (see FIG. 6) on the third insulating layer 115 may be performed. For example, the protective layer 117 may be formed on the metal pattern formed on the same layer as the first connection electrode CM1 (see FIG. 2). In case that the protective layer 117 is formed on the metal pattern formed on the same layer as the first connection electrode CM1, damage to the metal pattern, which is formed on the same layer as the first connection electrode CM1, may be prevented or reduced in a process of etching the insulating layers arranged under the first organic insulating layer 121 by using the first organic insulating layer 121.

A contact hole may be formed in an insulating layer by photolithography or etching using a mask. In detail, the contact hole may be formed in the insulating layer by entirely forming a photoresist layer on the insulating layer, patterning the photoresist layer formed using the mask, and etching the insulating layer by using the patterned photoresist layer. For example, at least one mask may be required to form the contact hole in the insulating layer by the photolithography and etching.

Figure 25:
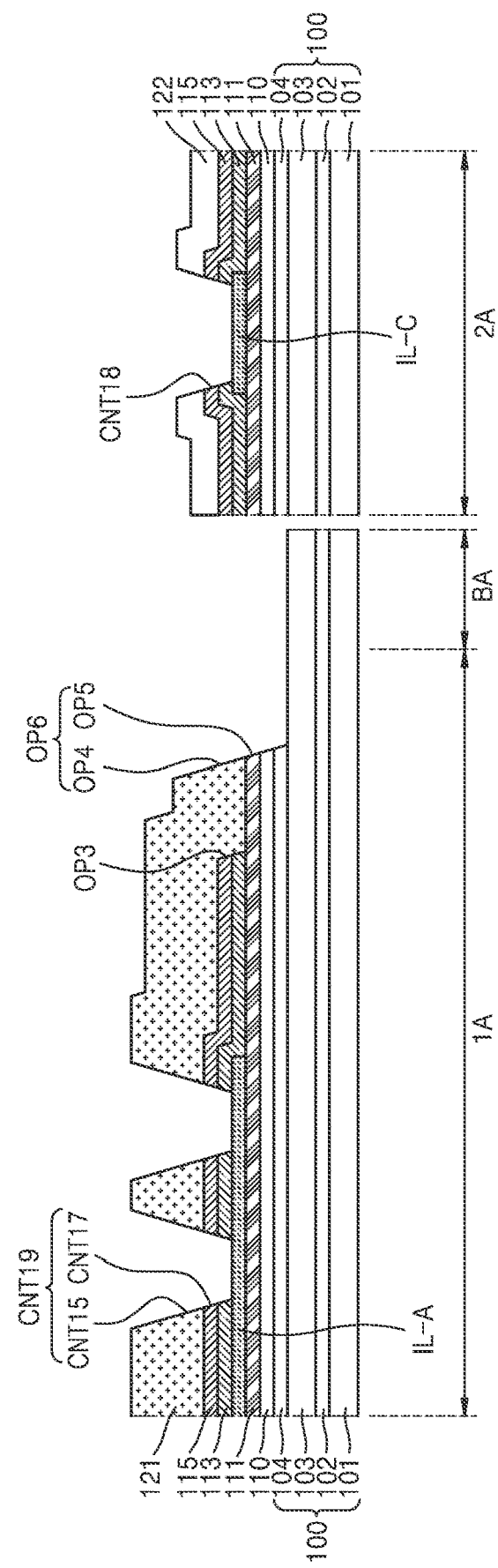

Referring to FIG. 25, in an embodiment, the inorganic insulating layers may be etched by using the organic insulating layer, which is formed on the inorganic insulating layers, as the photoresist layer. In detail, the second insulating layer 113 and/or the third insulating layer 115 arranged under the first organic insulating layer 121 may be etched by using, as the photoresist layer, the first organic insulating layer 121 formed on the third insulating layer 115. In this case, as the second insulating layer 113 and/or the third insulating layer 115 overlapping the fifteenth contact hole CNT15 defined in the first organic insulating layer 121 are etched, the seventeenth contact hole CNT17 may be formed. At least a portion of the first transmission line IL-A may be exposed through the seventeenth contact hole CNT17 defined in the second insulating layer 113 and/or the third insulating layer 115.

Also, the second barrier layer 104, the buffer layer 110, and the first insulating layer 111 arranged under the first organic insulating layer 121 may be etched by using, as the photoresist layer, the first organic insulating layer 121 formed on the first insulating layer 111. In this case, a fifth opening OP5 may be formed as the second barrier layer 104, the buffer layer 110, and the first insulating layer 111, which overlap the fourth opening OP4 defined in the first organic insulating layer 121, are etched. Although not illustrated, at least a portion of the second base layer 103 overlapping the fourth opening OP4 defined in the first organic insulating layer 121 may also be etched.

In an embodiment, the second insulating layer 113 and/or the third insulating layer 115 arranged under the via layer 122 may be etched by using, as the photoresist layer, the via layer 122 formed on the third insulating layer 115. In this case, as the second insulating layer 113 and/or the third insulating layer 115 overlapping the sixteenth contact hole CNT16 defined in the via layer 122 are etched, the eighteenth contact hole CNT18 may be formed. At least a portion of the third transmission line IL-C may be exposed through the eighteenth contact hole CNT18 defined in the second insulating layer 113 and/or the third insulating layer 115.

Therefore, as the inorganic insulating layer is etched by using the organic insulating layer, which is formed on the inorganic insulating layer, as the photoresist layer instead of using a separate photoresist layer, the number of masks used during the manufacture of the display apparatus may be reduced, and thus, manufacturing costs of the display apparatus may be reduced. In detail, the insulating layers arranged under the first organic insulating layer 121 are etched by using, as the photoresist layer, the first organic insulating layer 121 arranged on the first insulating layer 111 and the third insulating layer 115 in the first area 1A, and thus the number of masks used during the manufacture of the display apparatus may be reduced. Also, the number of masks used during the manufacture of the display apparatus may be reduced as the insulating layers arranged under the via layer 122 are etched by using the via layer 122, which is arranged on the third insulating layer 115 in the second area 2A, as the photoresist layer.

In an embodiment, the seventeenth contact hole CNT17 defined in the second insulating layer 113 and the third insulating layer 115 may be integrally formed with the fifteenth contact hole CNT15 defined in the first organic insulating layer 121. For example, the fifteenth contact hole CNT15 and the seventeenth contact hole CNT17 may form a nineteenth contact hole CNT19. In other words, the nineteenth contact hole CNT19 may include the fifteenth contact hole CNT15 and the seventeenth contact hole CNT17. In this case, because the fifteenth contact hole CNT15 is defined in the first organic insulating layer 121 and the seventeenth contact hole CNT17 is defined in the second insulating layer 113 and the third insulating layer 115, the nineteenth contact hole CNT19 may be defined in the second insulating layer 113, the third insulating layer 115, and the first organic insulating layer 121. For example, the nineteenth contact hole CNT19 of FIG. 25 may correspond to the sixth contact hole CNT6 (see FIG. 5).

In an embodiment, the fourth opening OP4 defined in the first organic insulating layer 121 may be integrally formed with the fifth opening OP5 defined in the second barrier layer 104, the buffer layer 110, and the first insulating layer 111. For example, the fourth opening OP4 and the fifth opening OP5 may form a sixth opening OP6. In other words, the sixth opening OP6 may include the fourth opening OP4 and the fifth opening OP5. In this case, because the fourth opening OP4 is defined in the first organic insulating layer 121 and the fifth opening OP5 is defined in the second barrier layer 104, the buffer layer 110, and the first insulating layer 111, the sixth opening OP6 may be defined in the second barrier layer 104, the buffer layer 110, the first insulating layer 111, and the first organic insulating layer 121. For example, the sixth opening OP6 of FIG. 25 may correspond to the second opening OP2 (see FIG. 2) of FIG. 5.

Figure 26:
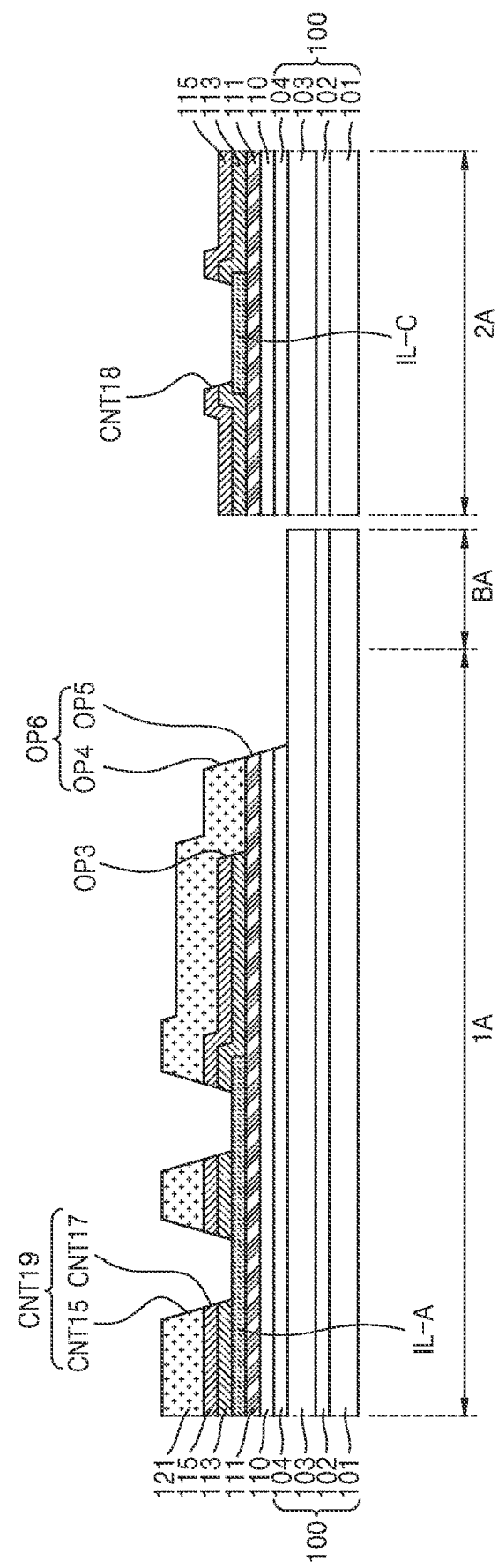

Referring to FIG. 26, the via layer 122 in the second area 2A may be removed. While the via layer 122 in the second area 2A is removed, at least a portion of the first organic insulating layer 121 in the first area 1A may also be removed. Therefore, the thickness of the first organic insulating layer 121 in the first area 1A may be slightly reduced.

Figure 27:
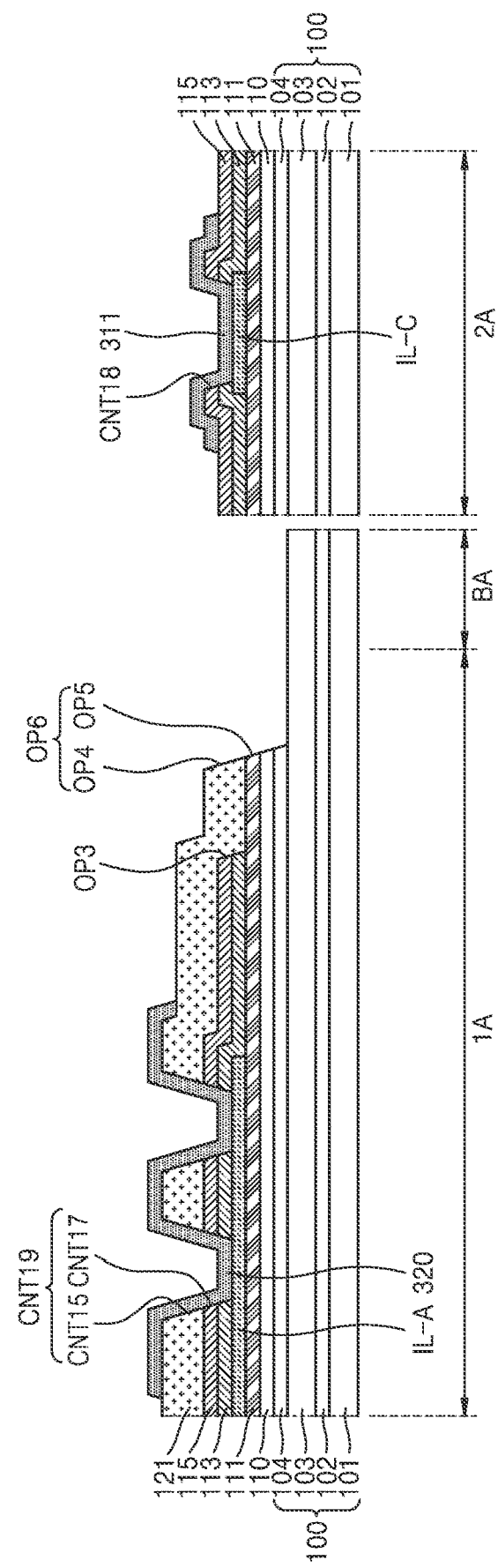

Referring to FIG. 27, the conductive pattern 320 may be formed in the first area 1A, and the first pad electrode 311 may be formed in the second area 2A. The conductive pattern 320 may be formed on the first organic insulating layer 121 and the first transmission line IL-A of which at least a portion is exposed through the nineteenth contact hole CNT19. For example, the conductive pattern 320 may directly contact the first transmission line IL-A of which at least a portion is exposed through the nineteenth contact hole CNT19.

The first pad electrode 311 may be formed on the third insulating layer 115 and the third transmission line IL-C of which at least a portion is exposed through the eighteenth contact hole CNT18. For example, the first pad electrode 311 may be directly formed on the third transmission line IL-C of which at least a portion is exposed through the eighteenth contact hole CNT18.

Figure 28:
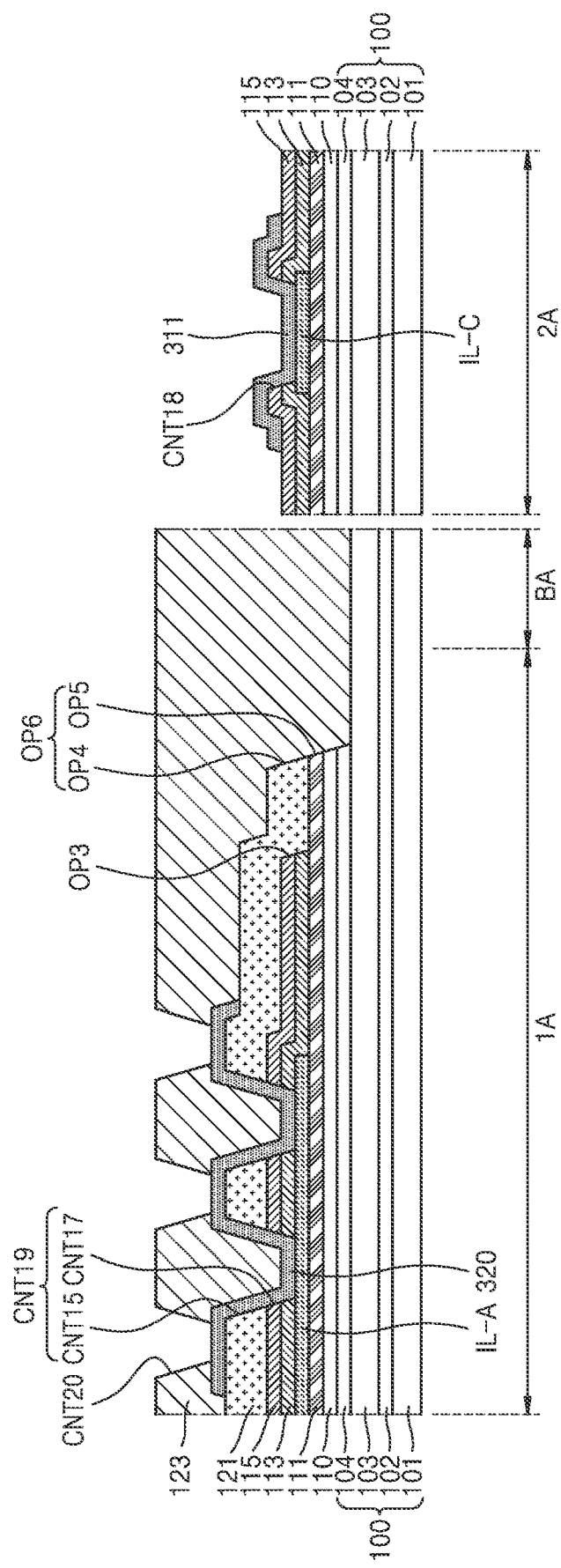

Referring to FIG. 28, the second organic insulating layer 123 may be formed in the first area 1A. In detail, the second organic insulating layer 123, in which a twentieth contact hole CNT20 exposing at least a portion of the conductive pattern 320 is defined, may be formed in the first area 1A. The second organic insulating layer 123 may also be formed in the bending area BA. However, the second organic insulating layer 123 may not be formed in the second area 2A. For example, after a material for forming the second organic insulating layer 123 is entirely spread, a material in the second area 2A may be removed.

Figure 29:
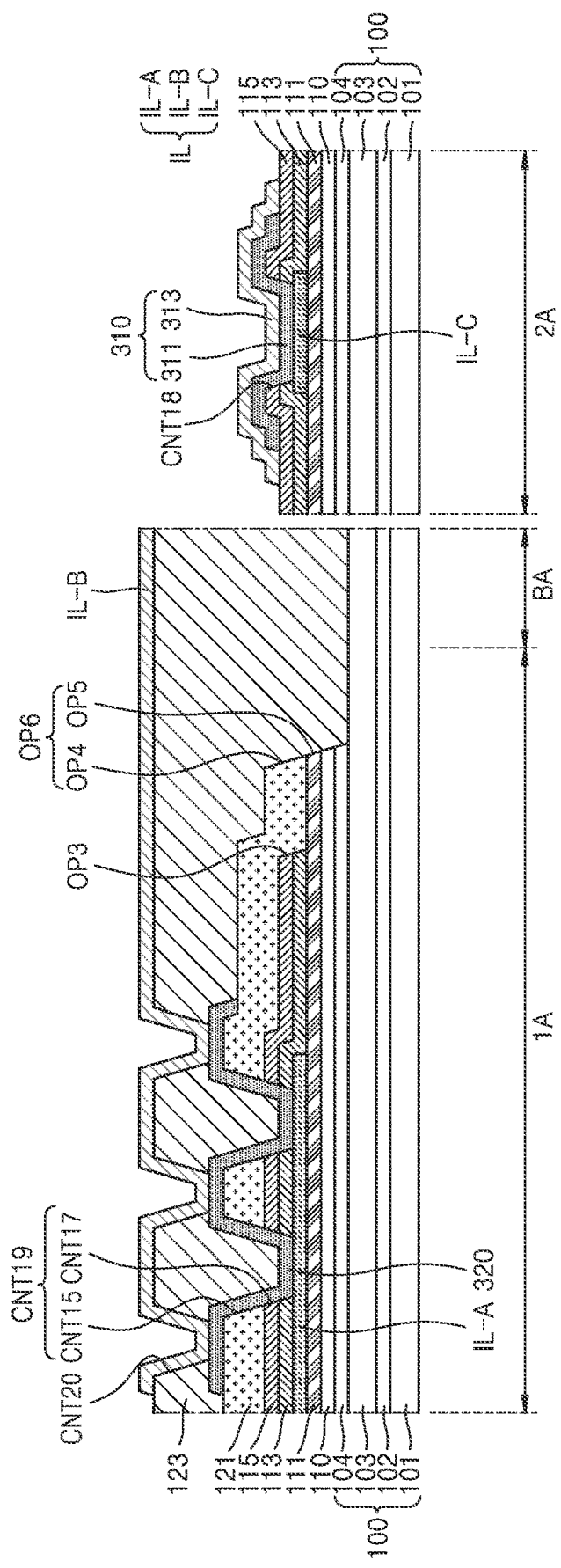

Referring to FIG. 29, the second transmission line IL-B may be formed in the first area 1A and the bending area BA, and the second pad electrode 313 may be formed in the second area 2A. The second transmission line IL-B may be formed on the second organic insulating layer 123 and the conductive pattern 320 of which at least a portion is exposed through the twentieth contact hole CNT20. For example, the second transmission line IL-B may be directly formed on the conductive pattern 320 of which at least a portion is exposed through the twentieth contact hole CNT20.

In an embodiment, the first transmission line IL-A may be electrically connected to the second transmission line IL-B through the conductive pattern 320. Because the first transmission line IL-A of the input line IL may be electrically connected to the conductive pattern 320 and the conductive pattern 320 may be electrically connected to the second transmission line IL-B of the input line IL, the first transmission line IL-A of the input line IL may be electrically connected to the second transmission line IL-B of the input line IL.

The second pad electrode 313 may be formed on the first pad electrode 311 and the third insulating layer 115. For example, the second pad electrode 313 may cover the first pad electrode 311 and may be directly formed on the same.

In an embodiment, the first pad electrode 311 and the second pad electrode 313 of the pad 310 may be sequentially formed on the third transmission line IL-C. Therefore, the third transmission line IL-C may be electrically connected to the pad 310.

FIGS. 30 to 34 are schematic cross-sectional views illustrating a method of manufacturing a display apparatus, according to an embodiment. In detail, FIGS. 30 to 34 correspond to a method of manufacturing the structure of FIG. 15.

Figure 30:
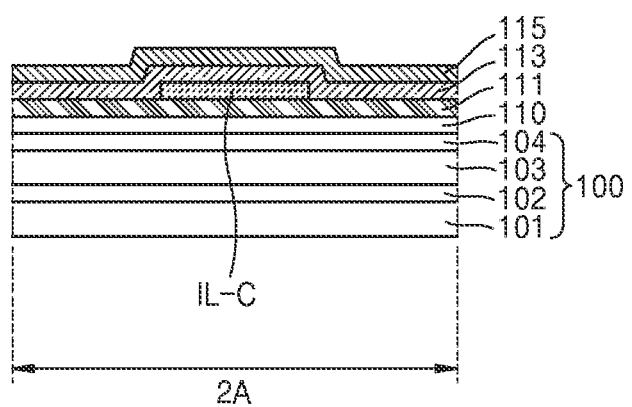
FIGS. 30 to 34 are schematic cross-sectional views illustrating a method of manufacturing a display apparatus, according to an embodiment.

Referring to FIG. 30, the buffer layer 110 and the first insulating layer 111 may be formed on the substrate 100. As described above with reference to FIG. 2, the substrate 100 may include the first base layer 101, the first barrier layer 102, the second base layer 103, and the second barrier layer 104 that are sequentially stacked.

Also, the third transmission line IL-C may be formed on the substrate 100. In detail, the third transmission line IL-C may be formed on the first insulating layer 111 of the second area 2A.

An inorganic insulating layer (e.g., the second insulating layer 113 and the third insulating layer 115) may be formed on the substrate 100. For example, the second insulating layer 113 and the third insulating layer 115 may be formed on the third transmission line IL-C.

Figure 31:
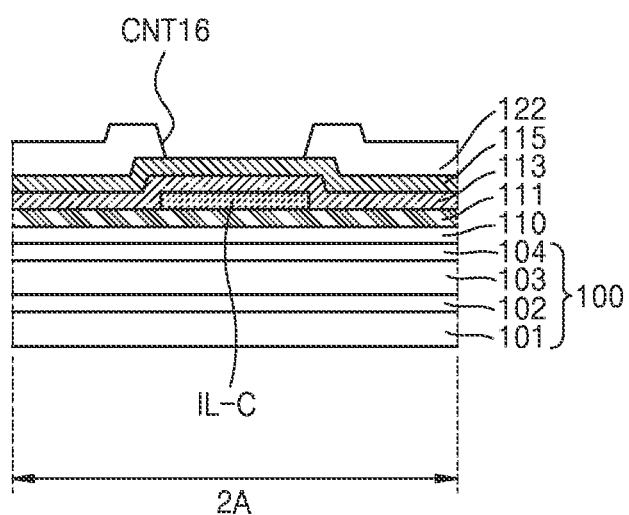

Referring to FIG. 31, the via layer 122 may be formed on the inorganic insulating layer (e.g., the second insulating layer 113 and the third insulating layer 115). The via layer 122 may be directly formed on the third insulating layer 115. The second contact hole (e.g., the sixteenth contact hole CNT16) exposing at least a portion of the third insulating layer 115 may be defined in the via layer 122.

Figure 32:
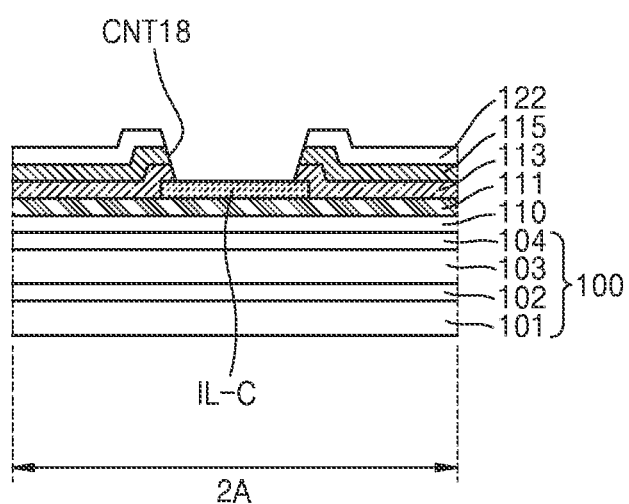

Referring to FIG. 32, the second insulating layer 113 and/or the third insulating layer 115 arranged under the via layer 122 may be etched by using, as the photoresist layer, the via layer 122 formed on the third insulating layer 115. In this case, as the second insulating layer 113 and/or the third insulating layer 115 overlapping the sixteenth contact hole CNT16 defined in the via layer 122 are etched, the eighteenth contact hole CNT18 may be formed. At least a portion of the third transmission line IL-C may be exposed through the eighteenth contact hole CNT18 defined in the second insulating layer 113 and/or the third insulating layer 115.

In an embodiment, when at least a portion of the second insulating layer 113 and/or the third insulating layer 115 is etched, a portion of the via layer 122 may also be etched. Therefore, the thickness of the via layer 122 may be reduced. Also, when at least a portion of the second insulating layer 113 and/or the third insulating layer 115 is etched, at least a portion of the third transmission line IL-C may also be etched.

Figure 33:
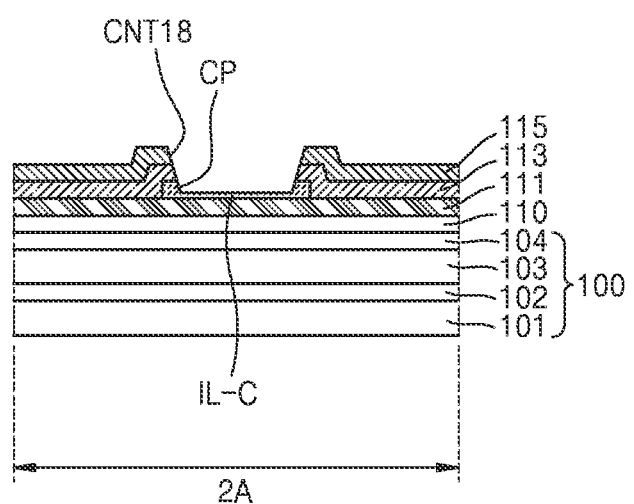

Referring to FIG. 33, the via layer 122 arranged on the third insulating layer 115 may be removed. In detail, in a process of forming the second connection electrode CM2 (see FIG. 2) by etching a metal layer, the via layer 122 arranged on the third insulating layer 115 may be etched. In this case, the via layer 122 may be removed.

Also, in the process of forming the second connection electrode CM2 (see FIG. 2) by etching the metal layer, at least a portion of the third transmission line IL-C, of which at least a portion is exposed through the eighteenth contact hole CNT18, may also be etched. As a result, the concave portion CP may be formed in the third transmission line IL-C.

Figure 34:
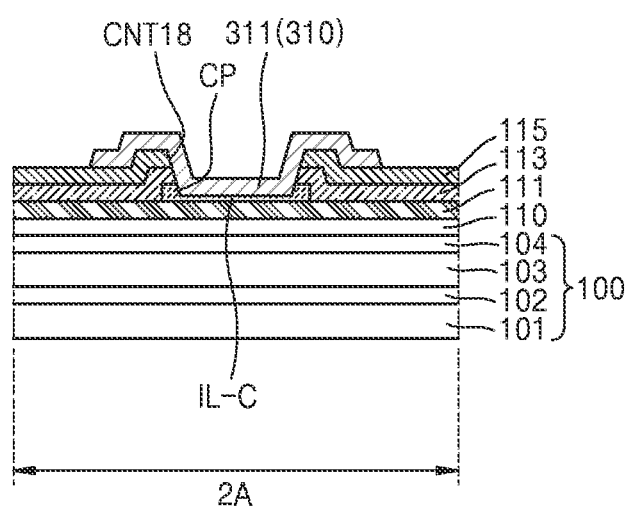

Thereafter, referring to FIG. 34, the first pad electrode 311 may be formed in the second area 2A. The first pad electrode 311 may be formed on the third transmission line IL-C and the third insulating layer 115 of which at least a portion is exposed through the eighteenth contact hole CNT18. For example, the first pad electrode 311 may be directly formed on the third transmission line IL-C of which at least a portion is exposed through the eighteenth contact hole CNT18. The first pad electrode 311 may be formed by using a same material through the same process as the third connection electrode CM3 (see FIG. 2) described above with reference to FIG. 2.

According to the one or more embodiments, a display apparatus, in which the number of masks used during the manufacture is reduced by patterning an organic insulating layer and etching inorganic insulating layers arranged under the organic insulating layer by using the patterned organic insulating layer, and a method of manufacturing the display apparatus may be realized. However, the scope of the disclosure is not limited by such effects.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display apparatus comprising:
  a peripheral area comprising:
    a first area;
    a bending area; and
    a second area;
  a display area;
  a first insulating layer located in the display area and at least a portion of the peripheral area and arranged on a substrate;
  a gate electrode located in the display area and arranged on the first insulating layer;
  a first connection electrode located in the display area and arranged on the gate electrode;
  a first organic insulating layer located in the display area and the peripheral area and overlapping the first connection electrode in a plan view;
  a second organic insulating layer located in the display area and the peripheral area and arranged on the first organic insulating layer; and
  an input line comprising:
    a first transmission line located in the first area and arranged on the first insulating layer; and
    a second transmission line located in the bending area and arranged on the second organic insulating layer.
2. The display apparatus of claim 1, further comprising:
  a data line located in the display area and electrically connected to the input line.
3. The display apparatus of claim 2, further comprising:
  a buffer layer located in the display area and the peripheral area and arranged on the substrate;
  a semiconductor pattern located in the display area and arranged between the buffer layer and the first insulating layer;
  a second insulating layer located in the display area and the peripheral area and arranged on the gate electrode;
  an upper electrode located in the display area and arranged on the second insulating layer;
  a third insulating layer located in the display area and the peripheral area and arranged on the upper electrode;

a second connection electrode located in the display area and arranged between the first organic insulating layer and the second organic insulating layer; and a third connection electrode located in the display area and arranged on the second organic insulating layer.

4. The display apparatus of claim 3, wherein at least a portion of the second transmission line extends to the first area.

5. The display apparatus of claim 4, further comprising: a conductive pattern located in the first area and arranged on the first organic insulating layer.

6. The display apparatus of claim 5, further comprising:
a first contact hole exposing at least a portion of the first transmission line; and a second contact hole exposing at least a portion of the conductive pattern.

7. The display apparatus of claim 6, wherein the first contact hole is in the second insulating layer, the third insulating layer, and the first organic insulating layer.

8. The display apparatus of claim 6, wherein the second contact hole is in the second organic insulating layer.

9. The display apparatus of claim 6, wherein
the first transmission line is electrically connected to the conductive pattern through the first contact hole, and
the conductive pattern is electrically connected to the second transmission line through the second contact hole.

10. The display apparatus of claim 3, wherein
the first transmission line and the gate electrode are arranged on a same layer, or
the first transmission line and or the upper electrode are arranged on a same layer.

11. The display apparatus of claim 3, further comprising:
a third organic insulating layer located in the display area and the peripheral area and overlapping the second transmission line in a plan view.

12. The display apparatus of claim 3, further comprising:
a protective layer arranged between the third insulating layer and the first organic insulating layer.

13. The display apparatus of claim 3, wherein the input line further comprises a third transmission line located in the second area and arranged on the first insulating layer.

14. The display apparatus of claim 13, further comprising:
a pad located in the second area and arranged on the third transmission line,
wherein the pad comprises a first pad electrode arranged on the third transmission line.

15. The display apparatus of claim 14, further comprising:
a third contact hole exposing at least a portion of the third transmission line,
wherein the third transmission line is electrically connected to the first pad electrode through the third contact hole.

16. The display apparatus of claim 14, wherein the pad further comprises a second pad electrode arranged on the first pad electrode.

17. The display apparatus of claim 3, wherein
the input line further comprises a first input line and a second input line, and
the data line comprises a first data line and a second data line.

18. The display apparatus of claim 17, wherein
the first data line is directly and electrically connected to the first input line through a fourth contact hole, and
the second input line is electrically connected to the second data line through a data transmission line.

19. The display apparatus of claim 17, further comprising:
a horizontal connection line arranged on the first organic insulating layer and extending in a first direction; and
a vertical connection line arranged on the second organic insulating layer and extending in a second direction intersecting the first direction.

20. The display apparatus of claim 19, wherein the vertical connection line is electrically connected to the second input line.

21. The display apparatus of claim 19, wherein the first data line at least partially overlaps the horizontal connection line in a plan view.

22. The display apparatus of claim 19, wherein the horizontal connection line is electrically connected to the second data line and the vertical connection line.

23. The display apparatus of claim 22, wherein the horizontal connection line is electrically connected to the vertical connection line in the display area.

24. The display apparatus of claim 22, wherein the horizontal connection line is electrically connected to the second data line in the display area.

25. The display apparatus of claim 19, further comprising:
an auxiliary horizontal connection line spaced apart from the horizontal connection line in the first direction; and
an auxiliary vertical connection line spaced apart from the vertical connection line in the second direction.

26. The display apparatus of claim 25, wherein the second data line at least partially overlaps the auxiliary horizontal connection line in a plan view.

27. The display apparatus of claim 19, further comprising:
an additional vertical connection line arranged on the second organic insulating layer and electrically connected to the horizontal connection line and the second data line.

28. The display apparatus of claim 27, wherein the additional vertical connection line is electrically connected to the second data line in the peripheral area.

29. The display apparatus of claim 28, wherein the vertical connection line and the second data line are integral with each other.

30. The display apparatus of claim 27, further comprising:
an additional auxiliary vertical connection line spaced apart from the additional vertical connection line in the second direction.

* * * * *